United States Patent
Ebihara et al.

(10) Patent No.: US 10,128,370 B2
(45) Date of Patent: Nov. 13, 2018

(54) SEMICONDUCTOR DEVICE

(71) Applicant: Mitsubishi Electric Corporation, Chiyoda-ku (JP)

(72) Inventors: Kohei Ebihara, Tokyo (JP); Shiro Hino, Tokyo (JP); Koji Sadamatsu, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 47 days.

(21) Appl. No.: 15/502,409

(22) PCT Filed: Sep. 18, 2015

(86) PCT No.: PCT/JP2015/076698
§ 371 (c)(1),
(2) Date: Feb. 7, 2017

(87) PCT Pub. No.: WO2016/052261
PCT Pub. Date: Apr. 7, 2016

(65) Prior Publication Data
US 2017/0236935 A1 Aug. 17, 2017

(30) Foreign Application Priority Data
Oct. 1, 2014 (JP) .................................. 2014-203275

(51) Int. Cl.
H01L 29/78 (2006.01)
H01L 29/47 (2006.01)
(Continued)

(52) U.S. Cl.
CPC ...... H01L 29/7818 (2013.01); H01L 27/0629 (2013.01); H01L 29/0615 (2013.01);
(Continued)

(58) Field of Classification Search
CPC .................................................. H01L 29/1095
See application file for complete search history.

(56) References Cited

U.S. PATENT DOCUMENTS 8,217,419 B2 7/2012 Takaishi
8,729,605 B2 5/2014 Takaishi
(Continued)

FOREIGN PATENT DOCUMENTS

JP 2003-17701 A 1/2003
WO 2008/153142 A1 12/2008
(Continued)

OTHER PUBLICATIONS

International Search Report dated Dec. 22, 2015 in PCT/JP2015/076698 Filed Sep. 15, 2015.
International Preliminary Report on Patentability and Written Opinion dated Apr. 13, 2017 in PCT/JP2015/076698 filed Sep. 18, 2015 with English translation.

*Primary Examiner* — Matthew Reames
*Assistant Examiner* — Christopher Culbert
(74) *Attorney, Agent, or Firm* — Oblon, McClelland, Maier & Neustadt, L.L.P.

(57) ABSTRACT

A semiconductor device capable of increasing a value of current that flows through the whole chip until a p-n diode in a unit cell close to a termination operates and reducing a size of the chip and a cost of the chip resulting from the reduced size, and including a second well region formed on both sides, as seen in plan view, of the entirety of a plurality of first well regions, a second ohmic electrode located over the second well region, a third separation region of a first conductivity type that is positioned closer to the first well regions than the second ohmic electrode in the second well region and that is formed to penetrate the second well region from a surface layer of the second well region in a depth direction, and a second Schottky electrode located on the third separation region.

12 Claims, 17 Drawing Sheets

(51) Int. Cl.
*H01L 27/06* (2006.01)
*H01L 29/06* (2006.01)
*H01L 29/10* (2006.01)
*H01L 29/16* (2006.01)
*H01L 29/872* (2006.01)
*H01L 29/861* (2006.01)

(52) U.S. Cl.
CPC ...... *H01L 29/0696* (2013.01); *H01L 29/1095* (2013.01); *H01L 29/1608* (2013.01); *H01L 29/47* (2013.01); *H01L 29/7806* (2013.01); *H01L 29/7811* (2013.01); *H01L 29/7815* (2013.01); *H01L 29/8611* (2013.01); *H01L 29/872* (2013.01)

(56) References Cited

U.S. PATENT DOCUMENTS

| | | |
|---|---|---|
| 9,214,458 B2 | 12/2015 | Hino et al. |
| 9,419,127 B2 | 8/2016 | Takaishi |
| 9,577,086 B2 * | 2/2017 | Hino ................... H01L 29/47 |
| 2016/0079411 A1 | 3/2016 | Hino et al. |

FOREIGN PATENT DOCUMENTS

| | | |
|---|---|---|
| WO | 2012/001837 A1 | 1/2012 |
| WO | 2014/038110 A1 | 3/2014 |
| WO | 2014/162969 A1 | 10/2014 |

* cited by examiner

F I G. 7
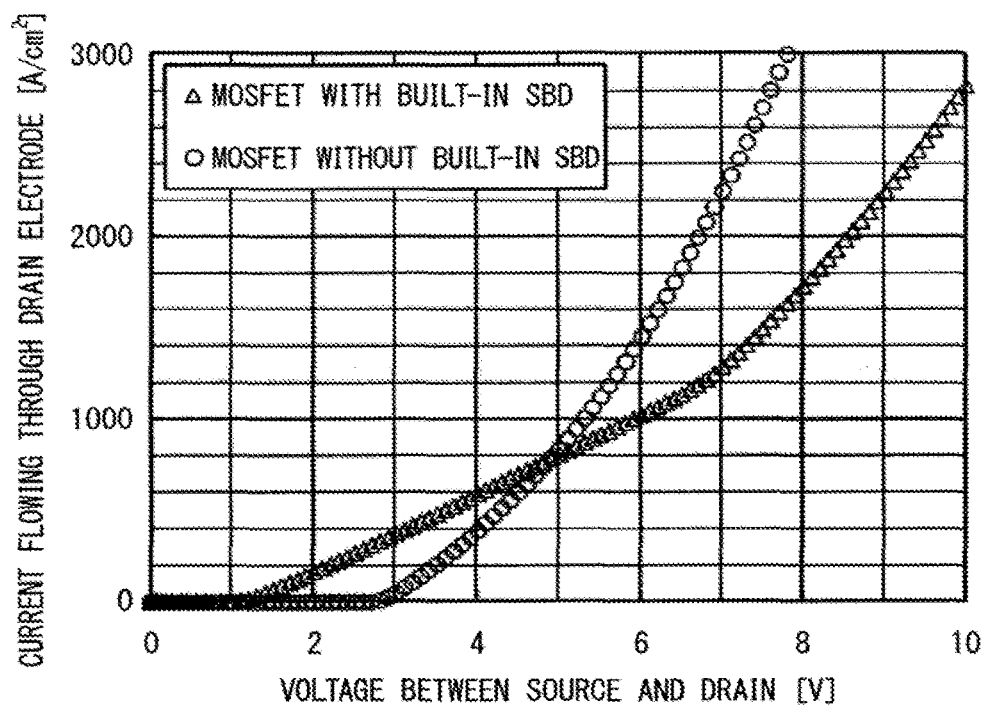
F I G. 8
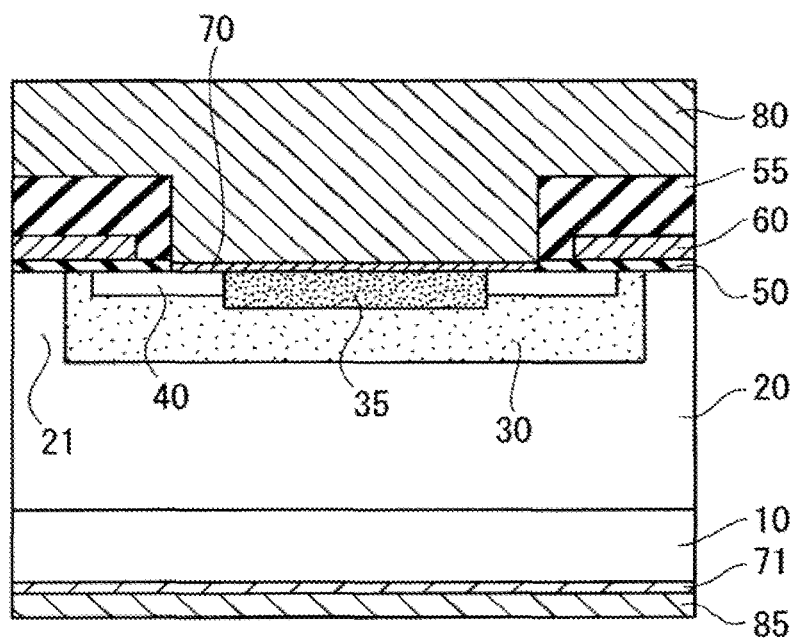

F I G. 2 0
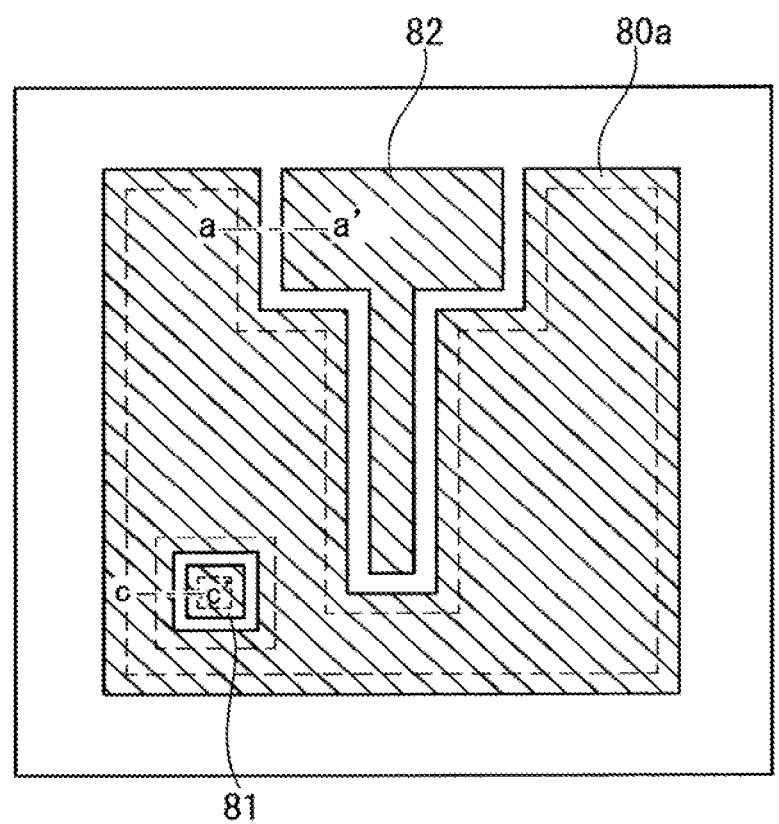

F I G. 2 4
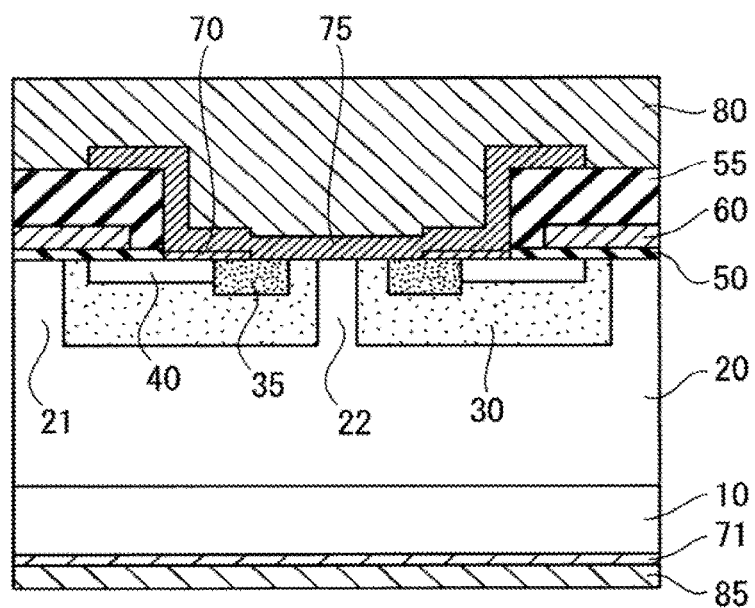

SEMICONDUCTOR DEVICE

TECHNICAL FIELD

The present invention relates to a semiconductor device.

BACKGROUND ART

In semiconductor devices such as metal-oxide-semiconductor field-effect-transistors (MOSFETs), built-in diodes can be used as reflux diodes. For example, Patent Document 1 proposes a method for using Schottky barrier diodes (SBDs) as reflux diodes that are built in unit cells of MOSFETs.

PRIOR ART DOCUMENT

Patent Document

Patent Document 1: Japanese Patent Application Laid-Open No. 2003-017701

SUMMARY OF INVENTION

Problems to be Solved by the Invention

A p-n diode is built in a semiconductor device such as a MOSFET. Thus, when the p-n diode operates while voltage is applied to the p-n diode in a forward direction, minority carriers are implanted in a drift layer.

Then, the minority carriers that have been implanted recombine with majority carriers in the drift layer, thereby generating energy (recombination energy). It is known that the energy disturbs a periodic structure depending on a semiconductor, causing crystal defects. Silicon carbide particularly has great recombination energy due to its great hand gap and also has various stable crystal structures, so that the crystal structures are easily changed. Therefore, the operation of the p-n diode easily causes occurrence of the crystal defects.

The disturbed crystal structure electrically has a high resistance, so that this phenomenon occurring particularly in an active region (namely, a region having unit cells including a channel) of the MOSFET increases an ON resistance, namely, an element resistance to a forward current between a source and a drain, and increases a conduction loss when current in the same density is passed.

The conduction loss is one of predominant losses in the MOSFET, so that the occurrence of the crystal defects in the MOSFET caused by the operation of the p-n diode in the active region increases heat generation of the MOSFET and makes a long-term stable operation difficult.

For the MOSFET with the built-in SBD, a diffusion potential of the SBD is designed lower than a diffusion potential of a p-n junction, and thus a unipolar current flows through the built-in SBD during a reflux operation until the p-n diode in the active region operates. Thus, the passage of a fixed amount of reflux current is allowed while the p-n diode is not operating, and the increase in the ON resistance can be avoided.

In a termination layout described in Patent Document 1, however, the increasing reflux current that flows through the MOSFET causes, at low voltage between a source and a drain, an operation of the p-n diode in a unit cell disposed in a region close to the termination before an operation of the p-n diode in a unit cell disposed in the center of the active region among a unit cell group in the MOSFET.

When a semiconductor device is used for a long time in usage conditions in which such voltage is exceeded, the ON resistance increases in the unit cells in the peripheral portion and in the unit cells in the central portion in the stated order, thereby increasing the ON resistance in the whole chip as well.

To suppress the increase in the ON resistance in the whole chip to an allowable amount or less, the reflux current flowing through the whole element needs to be limited to limit the current flowing through the p-n diode in the unit cell disposed in the region close to the termination. This indicates that the chip required to pass a desired current needs to be increased in size and that a cost of the chip is thus increased.

The present invention has been made in view of the above mentioned problems, and an object thereof is to increase a value of current flowing through the whole chip until a p-n diode in a unit cell close to a termination operates and to reduce a size of the chip and a cost of the chip resulting from the reduced size.

Means to Solve the Problems

A semiconductor device according to one aspect of the present invention includes: a drift layer of a first conductivity type formed on a semiconductor substrate of the first conductivity type; a plurality of first well regions of a second conductivity type located at an interval in a surface layer of the drift layer; a second well region of the second conductivity type formed on both sides, as seen in plan view, of the entirety of the plurality of first well regions in the surface layer of the drift layer, the second well region having a formation area larger than that of each of the first well regions; a first separation region of the first conductivity type formed to penetrate each of the first well regions from a surface layer of each of the first well regions in a depth direction; a source region of the first conductivity type formed on both sides, as seen in plan view, of the first separation region in the surface layer of each of the first well regions; a first Schottky electrode located on the first separation region; a first ohmic electrode located over each of the first well regions and located on the source region while contacting each of the first well regions and the source region; a second separation region of the first conductivity type being a region for separating the first well regions from each other; a second ohmic electrode located over the second well region; a third separation region of the first conductivity type that is positioned closer to the first well regions than the second ohmic electrode in the second well region and that is formed to penetrate the second well region from a surface layer of the second well region in the depth direction; a second Schottky electrode located on the third separation region; a gate electrode located, through a first insulating film, over part of the first and second well regions except for positions in which the first and second Schottky electrodes and the first and second ohmic electrodes are located; a second insulating film formed so as to cover the gate electrode; and a source electrode located so as to cover the first and second Schottky electrodes, the first and second ohmic electrodes, and the second insulating film.

A semiconductor device according to another aspect of the present invention includes: a drift layer of a first conductivity type formed on a semiconductor substrate of the first conductivity type; a plurality of first well regions of a second conductivity type located at an interval in a surface layer of the drift layer; a second well region of the second conductivity type formed on both sides, as seen in plan view, of the entirety of the plurality of first well regions in the surface layer of the drift layer, the second well region having a formation area larger than that of each of the first well regions; a sense region that includes at least one first well region of the plurality of first well regions and is separated from another first well region of the first well regions by the second well region formed on both sides, as seen in plan view, of the sense region; a first separation region of the first conductivity type formed to penetrate each of the first well regions in at least the sense region from a surface layer of each of the first well regions in a depth direction; a source region of the first conductivity type formed on both sides, as seen in plan view, of the first separation region in the surface layer of each of the first well regions in at least the sense region; a first Schottky electrode located on the first separation region; a first ohmic electrode located over each of the first well regions and located on the source region in at least the sense region; a second separation region of the first conductivity type being, a region for separating the first well regions from each other; a second ohmic electrode located over the second well region; a third separation region of the first conductivity type that is positioned closer to the sense region than the second ohmic electrode in the second well region and that is formed to penetrate the second well region from a surface layer of the second welt region in the depth direction; a second Schottky electrode located on the third separation region; a Rate electrode located, through a first insulating film, over part of the first and second well regions except for positions in which the first and second Schottky electrodes and the first and second ohmic electrodes are located; a second insulating film formed so as to cover the gate electrode; and a sense electrode located so as to cover the first Schottky electrode and the first ohmic electrode.

Effects of the Invention

According to the aspects of the present invention, the third separation region of the first conductivity type that is formed to penetrate the second well region from the surface layer of the second well region in the depth direction and the second Schottky electrode located on the third separation region are provided, to thereby cause a voltage drop in the drift layer around the second Schottky electrode in a reflux state. This relieves the voltage applied to the p-n diode in the first well regions located in the active region. Thus, an operation of the p-n diode can be suppressed, and a larger amount of current can be refluxed in the SBD. As a result, a larger amount of reflux current flows as the unipolar current through the whole chip, allowing a reduced size of the chip.

These and other objects, features, aspects and advantages of the present technology will become more apparent from the following detailed description of the present technology when taken in conjunction with the accompanying drawings.

BRIEF DESCRIPTION OF DRAWINGS

FIG. 7 is a diagram showing results, calculated by a device simulation, of current characteristics and voltage characteristics in a reflux state in, the unit cell of the MOSFET with the built-in SBD.

FIG. 8 is a schematic cross-sectional view of a unit cell of a MOSFET without a built-in SBD.

FIG. 20 is a schematic plan view schematically showing the whole semiconductor device having a built-in current sense according to the embodiment.

FIG. 24 is a schematic cross-sectional view of the unit cell of the MOSFET with the built-in SBD according to the embodiment.

DESCRIPTION OF EMBODIMENTS

Figure 1:
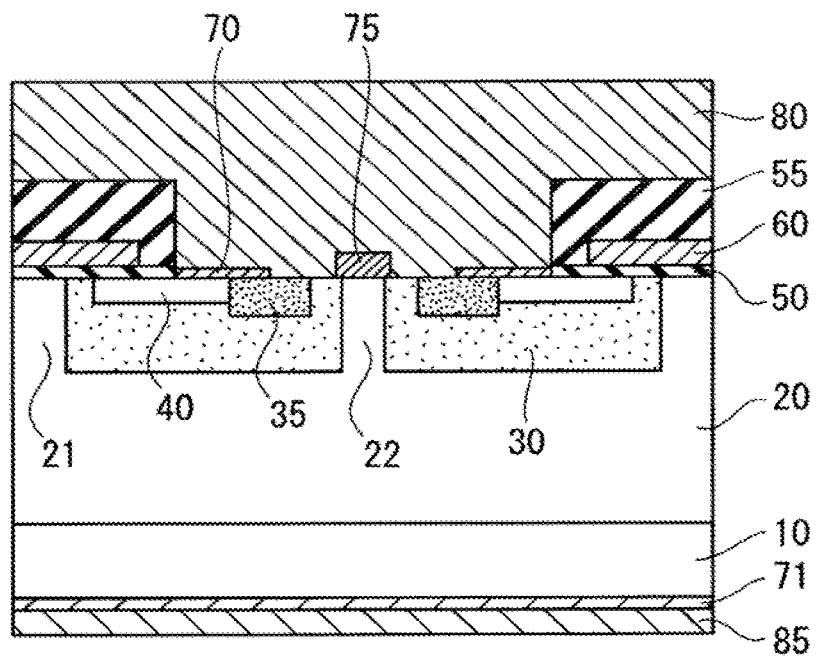
FIG. 1 is a schematic cross-sectional view of a unit cell of a MOSFET with a SBD according to an embodiment.

Hereinafter, embodiments are described with reference to the accompanying diagrams. In addition, the diagrams are schematically shown, and an interrelationship between size and a position of an image shown in each of the different diagrams is not necessarily accurate and may be appropriately modified. In the following description, the same components have the same reference numerals. Their names and functions are also the same. Accordingly, their detailed description will be omitted in some cases.

If terms that refer to specific positions and directions such as "up," "down," "side," "bottom," "front," and "back" are used in the following description, the terms are used for the sake of convenience to facilitate the understanding of the embodiment and are not related to actual directions in the embodiment.

In the embodiments below, a silicon carbide (SiC) semiconductor device is used as an example of semiconductor devices, and particularly, an n-channel silicon carbide MOSFET in which a first conductivity type is an n-type and a second conductivity type is a p-type is described as an example.

First Embodiment

<Configuration>

Figure 2:
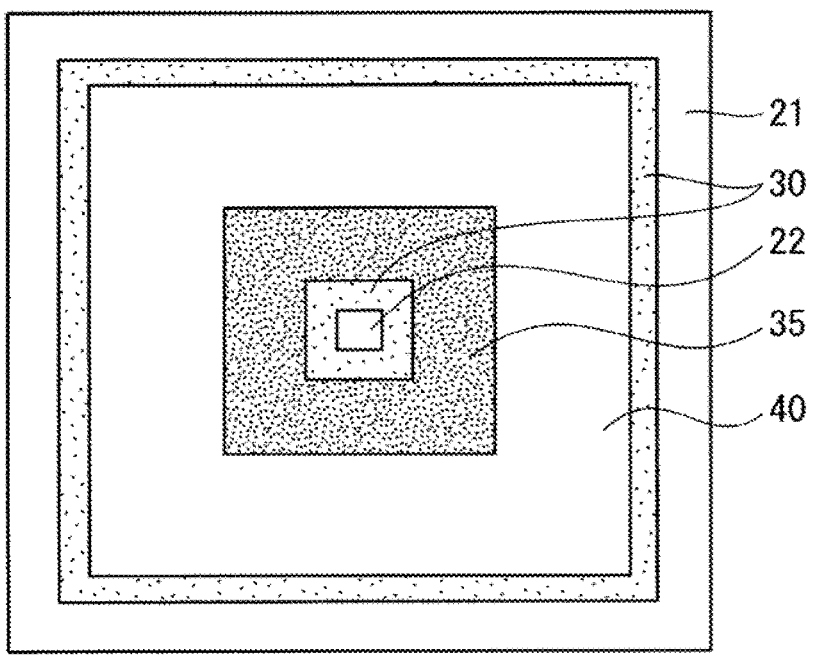
FIG. 2 is a schematic plan view of the unit cell of the MOSFET with the built-in SBD according to the embodiment.

First, a configuration of a semiconductor device according to a first embodiment is described. FIG. 1 is a schematic cross-sectional view of a unit cell of a MOSFET with a built-in SBD disposed in an active region. FIG. 2 is a diagram of the unit cell of the MOSFET with the built-M SBD when seen from above. FIG. 2 shows only a region (semiconductor region) in which a semiconductor layer is formed without showing an electrode, an insulating film, and the like in FIG. 1.

As shown in FIG. 1, the semiconductor device includes a drift layer 20 of n-type (first conductivity type) silicon carbide formed on a first main surface of a substrate 10 that has a polytype of 4H and is made of n-type (first conductivity type) silicon carbide having low resistance.

In FIGS. 1 and 2, the substrate 10 of silicon carbide has the first main surface in a plane direction of a (0001) plane, the first main surface being tilted 4" in a c-axis direction.

The drift layer 20 is an n-type (first conductivity type) semiconductor layer at a first impurity concentration. A plurality of well regions 30 of a p-type (second conductivity type) that contain aluminum (Al) being a p-type (second conductivity type) impurity are formed at an interval in a surface layer of the drift layer 20. A p-type (second conductivity type) impurity concentration in the well regions 30 is a second impurity concentration.

The well regions 30 shown in FIG. 1 are formed at two places at an interval in a cross-sectional view of the inside of the unit cell. A region for separating the well regions 30 from each other is an n-type (first conductivity type) region referred to as a second separation region 21. The second separation region 21 is a region formed in the surface layer portion of the drift layer 20 and a region having the same depth as a depth of the well regions 30 from the surface of the drift layer 20 in a depth direction.

Meanwhile, a first separation region 22 of the first conductivity type is formed to penetrate each of the well regions 30 from a surface layer of each of the well regions 30 in the depth direction. The first separation region 22 is a region located directly below a Schottky electrode 75 which will be described below.

A source region 40 of the n-type (first conductivity type) that contains nitrogen (N) being an n-type (first conductivity type) impurity is partially formed on the surface layer side of the well regions 30. The source region 40 is formed shallower than the depth of the well regions 30. The source region 40 is formed on both sides, as seen in a plan view, of the first separation region 22.

A first well contact region 35 of a p-type second conductivity type) that contains aluminum (Al) being the p-type (second conductivity type) impurity is preferably formed on the well region 30 sandwiched between the source region 40 and the first separation region 22 on the surface layer side of the drift layer 20.

A gate insulating film 50 of silicon oxide is formed across the surface of the second separation region 21, the surface of the well region 30, and part of the surface of the source region 40.

Further, a gate electrode 60 is formed on a surface of the gate insulating film 50 so as to correspond to the second separation region 21, the well regions 30, and an end portion of the source region 40. A region of the well region 30 that is sandwiched between the second separation region 21 and the source region 40, that corresponds to the gate electrode 60 through the gate insulating film 50 and that includes an inversion layer formed during ON operations is referred to as a channel region.

An interlayer insulating film 55 of silicon oxide is formed on the gate insulating film 50 so as to cover the gate electrode 60. An ohmic electrode 70 on a source side for reducing a contact resistance with silicon carbide is formed on a surface of the source region 40 that is not covered with the gate insulating layer 50 and formed on part of a surface of the first well contact region 35 on a side in contact with the source region 40. The well regions 30 can easily give and receive electrons to and from the source-side ohmic electrode 70 through the first well contact region 35 having low resistance.

The Schottky electrode 75 is formed on the surface of the first separation region 22 and is Schottky-connected to silicon carbide of the first separation region 22. The Schottky electrode 75 preferably includes at least the surface of the first separation region 22 but may not include it. The Schottky electrode 75 may be positioned such that the ohmic electrode 70 is formed on both sides, as seen in the plan view, of the Schottky electrode 75 over the well regions 30. The Schottky electrode 75 may further extend to the surface of the interlayer insulating film 55, as illustrated in FIG. 24.

A source electrode 80 is formed on the source-side ohmic electrode 70, the Schottky electrode 75, and the interlayer insulating film 55. The source electrode 80 electrically short-circuits the source-side ohmic electrode 70 and the Schottky electrode 75. In other words, the source-side ohmic electrode 70 is electrically connected to the Schottky electrode 75.

A drain electrode 85 is formed on a second main surface of the substrate 10 opposite to the first main surface thereof, namely, on a back surface side of the substrate 10 through a back surface ohmic electrode 71. Although it is not shown, the gate electrode 60 is electrically short-circuited to a gate pad and gate wiring through a gate contact hole penetrating the interlayer insulating film 55 in part of a region without the unit cell in the semiconductor device.

The second separation region 21 is a path through which an ON current flows when the MOSFET is ON, and the first separation region 22 is a path through which a unipolar current as a reflux current of the SBD flows, which will be described below in detail.

Figure 3:
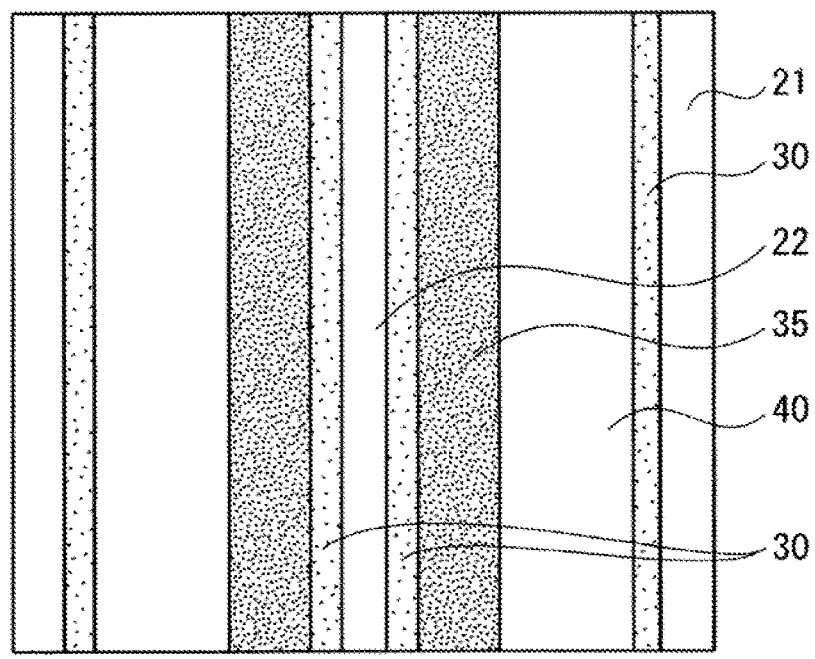
FIG. 3 is a schematic plan view of the unit cell of the MOSFET with the built-in SBD according to the embodiment.

The unit cell may have a pattern such as a stripe pattern shown in FIG. 3 other than the mesh pattern shown in FIG. 2. FIG. 3 is a diagram of the unit cell of the MOSFET with the built-in SBD when seen from above.

Figure 4:
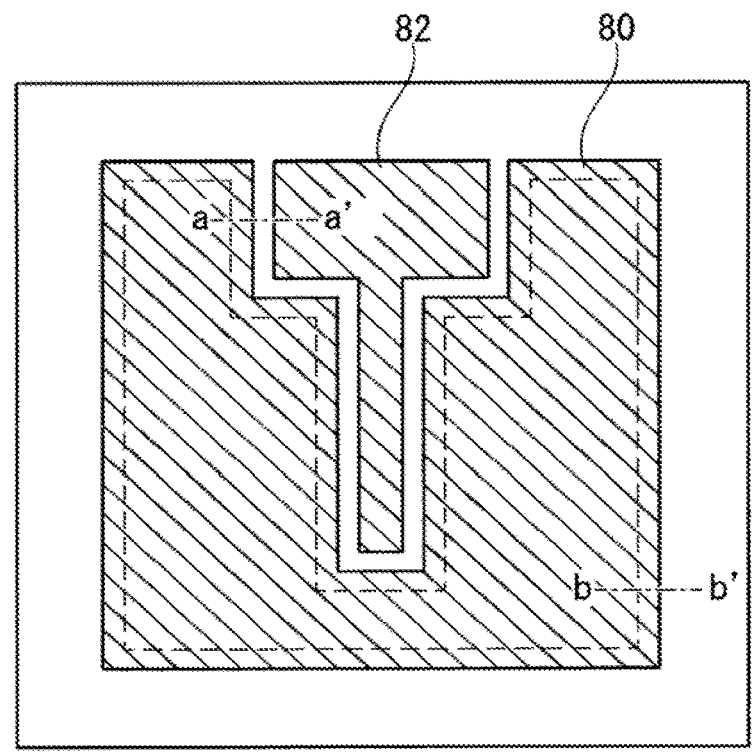
FIG. 4 is a schematic plan view schematically showing the whole semiconductor device according to the embodiment.

FIG. 4 is a diagram of the semiconductor device when seen from above or from the first main surface side. FIG. 4 indicates a plan position of the active region by broken lines. The source electrode 80 is formed so as to include the plan position of the active region. The gate electrode 82 electrically insulated from the source electrode 80 is formed on the first main surface. A region of the whole semiconductor device except for the active region in which the unit cells are arranged periodically is referred to as an ineffective region in this specification.

Figure 5A:
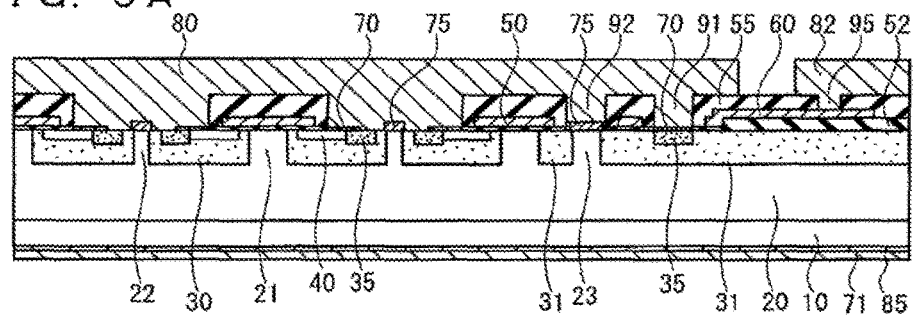
FIG. 5 is a schematic cross-sectional view and a schematic plan view of the semiconductor device according to the embodiment, and a schematic cross-sectional view without the use of the present invention.
Figure 5B:
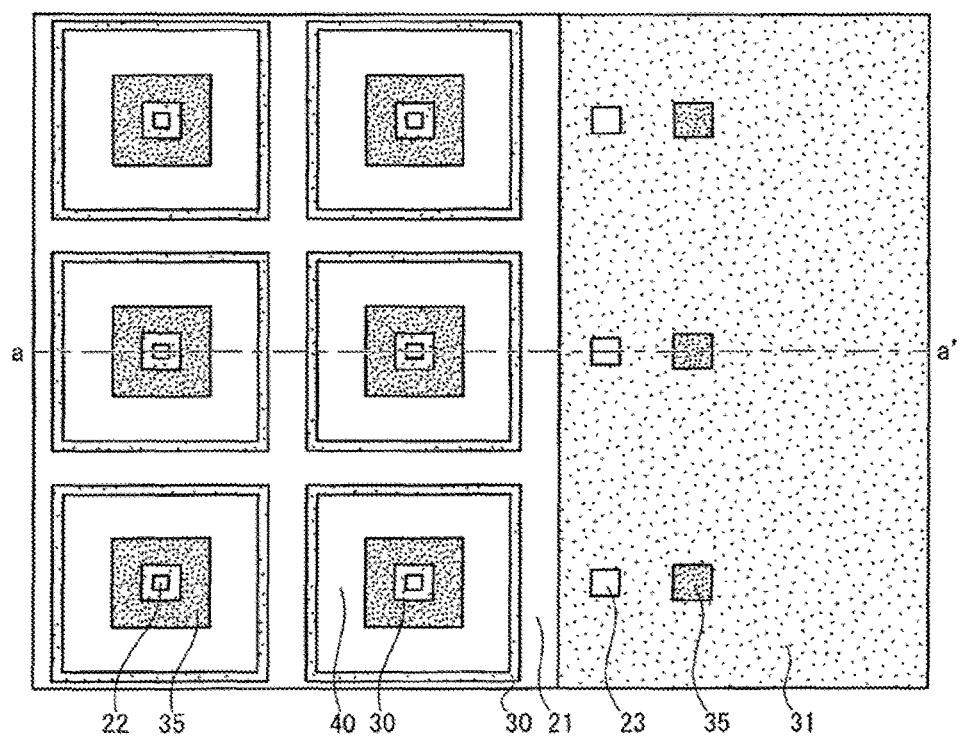
Figure 5C:
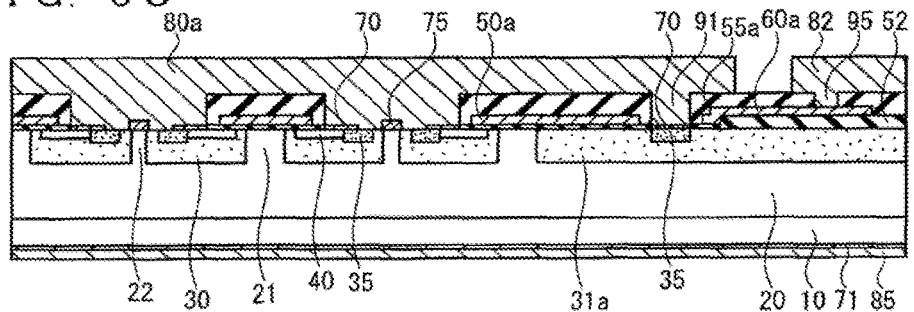

FIG. 5A is a diagram for describing a structure of a portion, which is adjacent to the gate electrode 82, of a termination of the active region, and is a schematic cross-sectional view corresponding to a position of a-a' in FIG. 3. FIG. 5B is a schematic plan view of the portion of FIG. 5A, and shows only the semiconductor region without showing the electrode, the insulating film, and the like. FIG. 5C is a schematic cross-sectional view of the same portion without the use of the present invention.

Figure 6A:
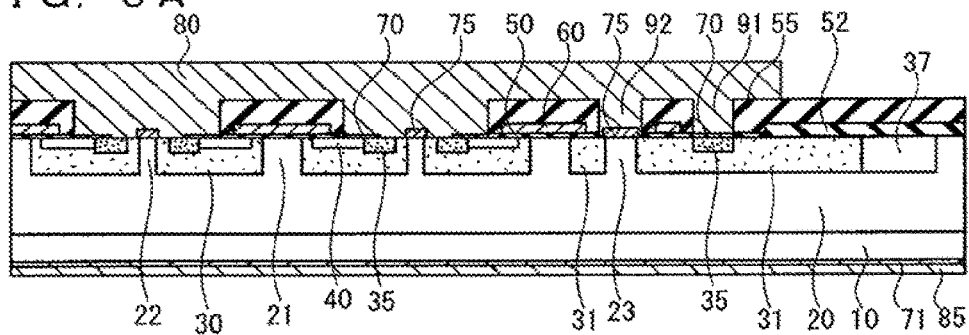
FIG. 6 is a schematic cross-sectional view and a schematic plan view of the semiconductor device according to the embodiment and a schematic cross-sectional view without the use of the present invention.
Figure 6B:
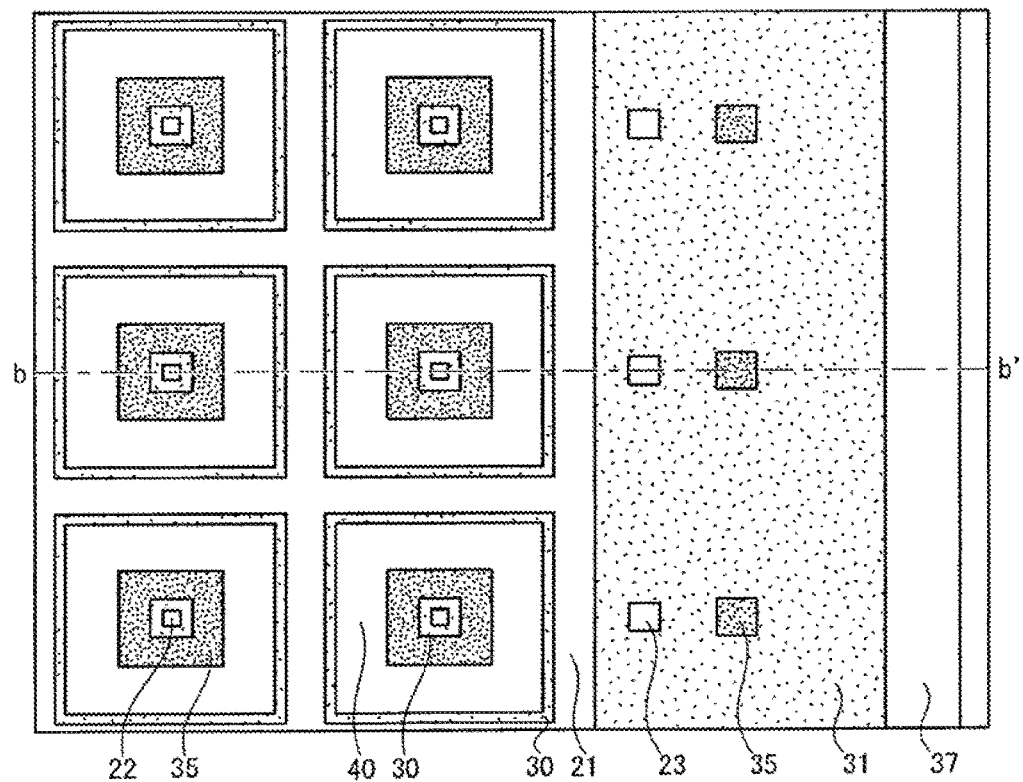
Figure 6C:
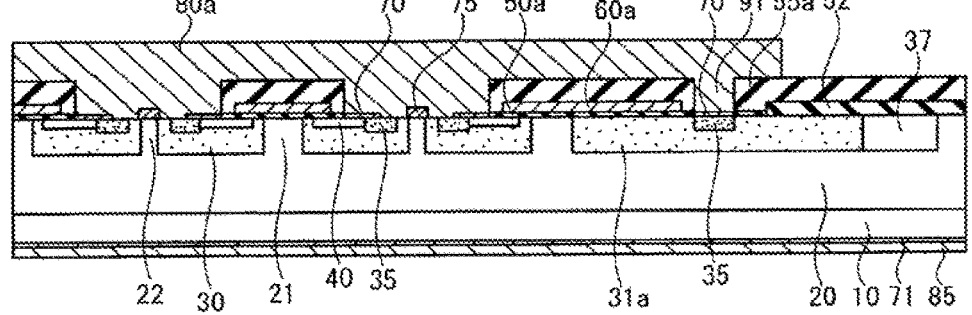

FIG. 6A is a diagram for describing a structure of a portion, which is adjacent to the termination of the chip, of the termination of the active region, and is a schematic cross-sectional view corresponding to a position of b-b' in FIG. 4. FIG. 6B is a schematic plan view of the portion of FIG. 6A, and shows only the semiconductor region without showing the electrode, the insulating film, and the like. FIG. 6C is a schematic cross-sectional view of the same portion without the use of the present invention.

In FIG. 5, the gate electrode 82 is formed on the interlayer insulating film 55 and is electrically connected to the gate electrode 60 through a gate contact hole 95 penetrating part of the interlayer insulating film 55. A wide well region 31 is formed around the active region, and the wide well region 31 and the well region 30 in the outermost peripheral unit cell sandwich the n-type region having the same width as that of the second separation region 21, the wide well region 31 having a formation area larger than that of the well region 30.

The plan position of the wide well region 31 includes the plan position of the gate electrode 82. The wide well region 31 is connected, in a position close to the active region, to the source electrode 80 through a well contact hole 91 that penetrates part of the interlayer insulating film 55 located on a side adjacent to the well regions 30. The first well contact region 35 and the ohmic electrode 70 (second ohmic electrode) are formed in a surface layer portion of the wide well region 31 that contacts the well contact hole 91. A field insulating film 52 having a thickness greater than that of the gate insulating film 50 is partially formed in a layer above the drift layer 20 and below the gate electrode 60 and is positioned farther from the active region than plan positions of the well contact hole 91 and an SBD contact hole 92.

In FIG. 6, the wide well region 31 is formed around the active region, and the wide well region 31 and the well region 30 in the outermost peripheral unit cell sandwich the n-type region having the same width as that of the second separation region 21, the wide well region 31 having the area larger than that of the well region 30. A junction termination extension (JTE) region 37 of a p-type having an impurity concentration lower than that of the wide well region 31 is formed closer to the peripheral side of the element than the wide well region 31. The JTE region 37 is connected to the wide well region 31.

The wide well region 31 is connected to the source electrode 80 through the well contact hole 91 that penetrates part of the interlayer insulating film 55 located on the side adjacent to the well regions 30. The first well contact region 35 and the ohmic electrode 70 are formed in the surface layer portion of the wide well region 31 that contacts the well contact hole 91.

In both of the positions of a-a' (see FIG. 4) and b-b' (see FIG. 4) only with the use of the present invention (FIGS. 5A, 5B, 6A, and 6B), part of the interlayer insulating film 55 and part of the gate insulating film 50 are removed to form the SBD contact hole 92 between the well region 30 in the outermost peripheral unit cell and the well contact hole 91, and the source electrode 80 contacts the Schottky electrode 75 deposited on silicon carbide through the SBD contact hole 92. A third separation region 23 in which the wide well region 31 is not formed is located below the Schottky electrode 75. In other words, the third separation region 23 is surrounded by the wide well region 31 and is the n-type region due to a lack of p-type implantation for forming the wide well region 31. In other words, the third separation region 23 is formed so as to penetrate the wide well region 31 from the surface layer of the wide well region 31 in the depth direction. Thus, the SBD surrounded by the wide well region 31 is formed in the ineffective region.

Both of the SBDs formed in the active region and the ineffective region have diffusion potential lower than diffusion potential of the p-n junction formed in silicon carbide.

<Manufacturing Method>

Next, a method for manufacturing the MOSFET with the built-in SBD, which is the semiconductor device, in this embodiment is described.

First, the drift layer 20 of silicon carbide having a thickness of 5 to 200 μm is epitaxially grown at an n-type impurity concentration of $1 \times 10^{14}$ to $1 \times 10^{17}$ cm$^{-3}$ by chemical vapor deposition (CVD) on the surface of the substrate 10 that has the first main surface in the plane direction of the (0001) plane, has the polytype of 4H, and is made of the n-type silicon carbide having low resistance.

Next, an implantation mask is formed on the surface of the drift layer 20 with a photoresist or the like, and Al being the p-type impurity is ion-implanted. At this time, a depth of the ion implantation of Al is about 0.5 to 3 μm that does not exceed the thickness of the drift layer 20. An impurity concentration of ion-implanted Al is in a range of $1 \times 10^{17}$ to $1 \times 10^{19}$ cm$^{-3}$ and is higher than the first impurity concentration in the drift layer 20. Subsequently, the implantation mask is removed. The regions ion-implanted with Al in this step are the well regions 30 and the wide well region 31.

Next, an implantation mask is formed on the surface of the drift layer 20 with a photoresist or the like, and Al being the p-type impurity is ion-implanted. At this time, a depth of the ion implantation of Al is about 0.5 to 3 μm that does not exceed the thickness of the drift layer 20. An impurity concentration of ion-implanted Al is in a range of $1 \times 10^{16}$ to $1 \times 10^{18}$ cm$^{-3}$, is higher than the first impurity concentration in the drift layer 20, and is lower than the concentration of Al in the well regions 30. Subsequently, the implantation mask is removed. The region ion-implanted with. Al in this step is the JTE region 37.

Next, an implantation mask is formed on the surface of the drill layer 20 with the photoresist or the like, and N being the n-type impurity is ion-implanted. A depth of the ion implantation of N is shallower than the thickness of the well regions 30. An impurity concentration of ion-implanted N is in a range of $1 \times 10^{18}$ to $1 \times 10^{21}$ cm$^{-3}$ and exceeds the second impurity concentration of the p-type in the well regions 30. The region of the n-type among the regions implanted with N in this step is the source region 40.

Next, an implantation mask is formed on the surface of the drift layer 20 with the photoresist or the like, Al being the p-type impurity is ion-implanted, and the implantation mask is removed. The region implanted with. Al in this step is the first well contact region 35. The first well contact region 35 is provided for obtaining sufficient electrical contact between the well regions 30 and the source-side ohmic electrode 70, and the p-type impurity concentration in the first well contact region 35 is preferably set at a concentration higher than the second impurity concentration of the p-type in the well regions 30. For ion implantation of the p-type impurity in this step, the substrate 10 or the drift layer 20 is preferably heated to 150° C. or higher for the ion implantation for the purpose of lowering the resistance in the first well contact region 35.

Next, a heat treatment device performs annealing far 30 seconds to an hour in an atmosphere of inert gas such as argon (Ar) gas (at 1300 to 1900° C.). The annealing electrically activates N and Al, which have been ion-implanted.

Then, the field insulating film 52 that has a thickness of about 0.5 to 2 μm and is formed of a silicon dioxide film is formed by the CVD, the photolithography technique, or the like in a region except for the position nearly corresponding to the above-mentioned active region. At this time, the field insulating film 52 in the position nearly corresponding to the cell region may be removed by the photolithography technique or etching after being formed on the entire surface, for example.

Then, a surface of silicon carbide that is not covered with the field insulating film 52 is thermally oxidized to form silicon oxide that is the gate insulating film 50 having a desired, thickness. Next, a polycrystalline silicon film having conductivity is formed on the gate insulating film 50 by low pressure CVD and patterned to form the gate electrode 60. Then, the interlayer insulating film 55 is formed by the low pressure CVD. Subsequently, a contact hole that penetrates the interlayer insulating film 55 and the gate insulating film 50 and reaches the first well contact region 35 and the source region 40 in the unit cell is formed simultaneously with the well contact hole 91.

Next, after a metal film that contains Ni as a main component is formed by sputtering or the like, a heat treatment at temperatures of 600 to 1100° C. is performed to cause a reaction to occur between the metal film that contains Ni as the main component and the silicon carbide layer in the contact hole, to thereby form a silicide between the silicon carbide layer and the metal film. Then, the metal film remaining on the interlayer insulating film 55 except for the silicide formed by the reaction is removed by wet etching with any of sulfuric acid, nitric acid, and hydrochloric acid or a mixed solution of all of sulfuric acid, nitric, acid, and hydrochloric acid and aqueous hydrogen peroxide. This forms the source-side ohmic electrode 70.

Subsequently, metal that contains Ni as a main component is formed on the back surface (second main surface) of the substrate 10 and is heat-treated, to thereby form the back surface ohmic electrode 71 on the back side of the substrate 10.

Next, the interlayer insulating film 55 on the first separation region 22 and the interlayer insulating film 55 and the gate insulating film 50 in the positions of the SBD contact hole 92 and the gate contact hole 95 are removed by patterning with a photoresist or the like. The wet etching that does not damage the surface: of silicon carbide serving as an interface of the SBD is a preferred way of removal.

Then, the Schottky electrode 75 is deposited by sputtering or the like. Ti, Mo, Ni, or the like is preferably deposited as the Schottky electrode 75.

Subsequently, wiring metal of Al or the like is formed by sputtering or vapor deposition on the surface of the substrate 10 that has been processed so far and is processed into a predetermined shape by the photolithography technique, to thereby form the source electrode 80 that contacts the source-side ohmic electrode 70 and the Schottky electrode 75 and form the gate electrode 82 that contacts the gate electrode 60.

Furthermore, the drain electrode 85, which is the metal film, is formed on the surface of the back surface ohmic electrode 71 formed on the back side of the substrate 10, and the semiconductor device shown in FIGS. 1 to 6 is completed.

<Operations>

Next, operations of the MOSFET with the built-in SBD which is the semiconductor device, in this embodiment are simply described in three states.

The first state is hereinafter referred to as an "ON state" in which high voltage is applied to the drain electrode 85 with respect to the source electrode 80 and positive voltage greater than or equal to a threshold value is applied to the gate electrode 82.

In the ON state, an inversion channel is formed in the channel region, and a path through which electrons serving as carriers flow is formed between the source region 40 of the n-type and the second separation region 21 of the n-type. On the other hand, an electric field (reverse bias) in a direction in which current hardly flows through a Schottky junction, namely, a reverse direction, is applied to the built-in SBD, so that no current flows.

The electrons flowing from the source electrode 80 to the drain electrode 85 reach the drain electrode 85 from the source electrode 80 through the ohmic electrode 70, the source electrode 40, the channel region, the second separation region 21, the drift layer 20, and then the substrate 10 according to the electric field formed by the positive voltage applied to the drain electrode 85.

Therefore, the positive voltage is applied to the gate electrode 60, causing the ON current to flow from the drain electrode 85 to the source electrode 80. At this time, voltage applied between the source electrode 80 and the drain electrode 85 is referred to as an ON voltage, and a value in which the ON voltage is divided by a density of the ON current is referred to as an ON resistance. The ON resistance is equal to a total of a resistance in the path through which the electrons flow. A product of the ON resistance and the square of the ON current is equal to a conduction loss consumed when the MOSFET is energized, so that the ON resistance is preferably low. The ON current only flows through the active region including the channel and does not flow through the ineffective region.

The second state is hereinafter referred to as an "OFF state" in which high voltage is applied to the drain electrode 85 with respect to the source electrode 80 and a voltage less than or equal to the threshold value is applied to the gate electrode 60.

In the OFF state, the inversion channel is not formed in the channel region, so that the ON current does not flow, and the high voltage in the ON state is applied between the source electrode 80 and the drain electrode 85 of the MOSFET. At this time, the voltage of the gate electrode 82 is almost equal to the voltage of the source electrode 80, so that the high voltage is also applied between the gate electrode 82 and the drain electrode 85.

In the active region, the reverse bias is applied to a p-n junction formed between the well region 30 and the drift layer 20, and a thick depletion layer spreads to the drift layer 20 whose concentration is relatively low, so that the application of the voltage to the gate insulating film 50 can be prevented.

The gate insulating film 50 on the second separation region 21 does not include p-type region directly there below and is thus subjected to application of electric field strength relatively higher than that applied to the gate insulating film 50 on the well regions 30, but by appropriately limiting the width of the second separation region 21, a depletion layer that horizontally extends from the well regions 30 to the second separation region 21 can suppress the electric field applied to the gate insulating film 50 to a desired value or less. A thin depletion layer spreads to not only the drift layer 20 and the second separation region 21 but also to the well regions 30 of the p-type whose concentration is relatively high, so that holes generated by the depletion layer formed in the well regions 30 are discharged into the source electrode 80 through the first well contact region 35 in a process of shifting to the OFF state. In other words, electrical contact between the well regions 30 and the source electrode 80 can prevent the application of the high electric field strength to the gate insulating film 50 on the well regions 30 in the OFF state.

The region of the ineffective region in which the gate electrode 82 shown in FIG. 5 is disposed includes: the wide well region 31 formed in the region that includes most of the plan positions of the gate insulating film 50 and the field insulating film 52 located in the ineffective region; and the well contact hole 91 for allowing electrical contact between the wide well region 31 and the source electrode 80 in part of the well contact hole 91.

Similarly, this can prevent the application of the high electric field strength to the gate insulating film 50 and the field insulating film 52 located in the ineffective region.

In the termination region of the chip shown in FIG. 6 in the ineffective region, part of the wide well region 31 and the JTE region 37 in addition to the drift layer 20 are depleted, to thereby relieve a concentration of electric fields generated at the termination of the element and suppress a decrease in withstand voltage. At this time, holes generated in the depletion layer of the wide well region 31 and the JTE region 37 are discharged into the source electrode 80 through the nearest well contact hole 91.

On the other hand, an electric field in the same direction as the electric field in the "ON state" is applied to the built-in SBD, so that no current flows ideally. However, the applied electric field is much higher than that in the "ON state," and thus a leak current may occur.

The large leak current increases heat generation of the MOSFET, and the MOSFET and a module including the MOSFET may be thermally destroyed. Thus, an electric field applied to the Schottky junction s preferably suppressed in order to reduce the leak current.

The third state is a state in which a reflux current flows from the source electrode 80 toward the drain electrode 85 while a low voltage is applied to the drain electrode 85 with respect to the source electrode 80, that is to say, while a counter electromotive voltage is applied to the MOSFET. This state is hereinafter referred to as a "reflux state."

In the reflux state, an electric field (forward bias) in the forward direction is applied to the built-in SBD, and a unipolar current formed of an electron current flows from the Schottky electrode 75 toward the silicon carbide layer. When the voltage of the source electrode 80 with respect to the drain electrode 85 (the voltage between the source and the drain) is low, all the reflux current flows through the built-in SBD, causing no implantation of minority carriers in the drift layer 20. Thus, crystal defects do not occur, causing no increase in the ON resistance as well.

However, the voltage between the source and the drain further increases, and the p-n diode formed between the well region 30 and the drift layer 20 in the active region operates under particular conditions, causing the implantation of the minority carriers in the drift layer 20 in the active region. As a result, the crystal defects may occur.

The inventors find out that the conditions that cause the p-n diode to operate in the active region are influenced by surroundings of the unit cells. The inventors take that into consideration and discover a technique for making the p-n diode in the active region difficult to operate.

Prior to the descriptions, a periodic arrangement of the unit cells that endlessly continues is assumed for the sake of simplicity. In this case, a device simulation can be performed on the assumption that only the unit cells are cut from the periodicity and one unit cell is a mirror image of another unit cell if reflected at a boundary between the unit cells adjacent to each other. Hereinafter, the MOSFET with the built-in SBD that includes the unit cells in only the periodic arrangement is referred to as an ideal MOSFET with a built-in SBD.

FIG. 7 is a diagram showing results, calculated by the device simulation, of current characteristics and voltage characteristics in the reflux state in the unit cell of the MOSFET with the built-in SBD and the unit cell of the MOSFET without the built-in SBD. The vertical axis indicates a current [A/cm$^2$] that flows through the drain electrode, and the horizontal axis indicates a voltage between the source and the drain [V]. FIG. 7 indicates the characteristics of the MOSFET with the built-in SBD by triangular marks and the characteristics of the MOSFET without the built-in SBD by circular marks. FIG. 8 shows a cross-sectional view of the MOSFET without the built-in SBD whose characteristics are shown for comparison purposes.

It is clear from FIG. 7 that the current abruptly increases when the voltage between the source and the drain exceeds approximately 7 V in the MOSFET with the built-in SBD (triangular marks). It is conceivable that the p-n diode described above operates and the unipolar operation is shifted to the bipolar operation, causing conductivity modulation in the drift layer.

It deserves special mention that the voltage between the source and the drain that operates the p-n diode is higher in the MOSFET with the built-in SBD than in the MOSFET without the built-in SBD. This can be described as follows. Prior to the descriptions, it needs to be mentioned that the voltage applied to the p-n junction is a potential difference between the well region 30 and a contact surface of the drift layer 20 with the well region 30.

First, in the MOSFET without the built-in SBD, when the voltage between the source and the drain is less than or equal to the diffusion potential of the p-n diode or less than or equal to the voltage that operates the p-n diode, no current flows between the source and the drain, so that a potential of the drain electrode 85 is equal to a potential of the contact surface of the drift layer 20 with the well region 30. In other words, all the voltage between the source and the drain is applied to the p-n diode. Therefore, when the voltage between the source and the drain, which has been gradually increased, exceeds the operating voltage of the p-n diode, the p-n diode starts to operate, that is to say, the minority carriers start to be implanted in the drift layer 20.

On the other hand, in the MOSFET with the built-in SBD, when the voltage between the source and the drain is higher than the operating voltage of the SBD and is less than or equal to the operating voltage of the p-n diode, the unipolar current flows between the source and the drain through the SBD, causing a voltage drop in the conduction path according to a product of resistivity of the conduction path and a density of the current. In other words, the voltage drop also occurs in the drift layer 20 and the substrate 10. By an amount of voltage equal to the voltage drop, the potential of the contact surface of the drift layer 20 with the well region 30 is smaller than the voltage between the source and the drain. As a result of this effect, the MOSFET with the SBD has the high voltage between the source and the drain that operates the p-n diode, and allows the passage of a larger amount of unipolar current as the reflux current until the p-n diode operates.

Moreover, the vicinity of the termination of the active region in the MOSFET with the built-in SBD is considered. The unit cells at the termination of the active region are adjacent to the wide well region 31 as described above.

In the structures without the use of the present invention as shown in FIGS. 5C and 6C, no unipolar current can flow through the wide well region 31, so that most of the voltage between the source and the drain is applied to the p-n diode, which is the junction between the wide well region 31 and the drift layer 20.

Therefore, the voltage between the source and the drain exceeds the operating voltage of the p-n diode, causing the implantation of the minority carriers from the wide well region 31 into the drift layer 20. At this time, the holes diffused in the drift layer 20 recombine with electrons at this place, causing the crystal defects in the drift layer in the active region to increase the resistance of the drift layer 20.

However, since the path of the ON current is mainly in active region, extended defects occurring in the drift layer 20 located directly below the wide well region 31 rarely increase the resistance when the ON current passes through the active region, namely, the ON resistance.

The problem herein is the case where the voltage between the source and the drain applied to the p-n diode in the unit cells close to the termination of the active region, which is smaller than the voltage applied to the p-n diode in the unit cells of the ideal MOSFET with the built-in SBD, exceeds the operating voltage of the p-n diode to cause the implantation of the minority carriers from the well regions 30 into the drift layer 20. At this time, the holes diffused in the drift layer 20 recombine with electrons at this place, causing the crystal defects in the drift layer in the active region to increase the ON resistance.

The operating voltage of the paid diode in the unit cells close to the termination is decreased by a mechanism below.

The unipolar current by the SBD is diffused in the drift layer 20 located directly below the wide well region 31 in the outer most peripheral unit cells, and the voltage drop in the drift layer 20 located directly below the well regions 30 in the outermost peripheral unit cells is smaller than the voltage drop in the drift layer 20 of the ideal MOSFET with the built-in SBD. As a result, in the outermost peripheral unit cells, the voltage applied to the p-n diode increases, and the bipolar operation starts at the voltage between the source and the drain lower than that in the ideal MOSFET with the built-in SBD.

The unipolar current by the SBD may be diffused in the drift layer 20 located directly below the wide well region 31 not only in the outermost peripheral cells in the active region but also in the cells close to the outermost peripheral cells especially when the drift layer 20 has a great thickness. As a result, the outermost peripheral cells have the lowest voltage between the source and the drain for causing each of the unit cells to start the bipolar operation, and the cells closer to the inside have more similar characteristics to the characteristics of the ideal MOSFET with the built-in SBD.

In a case where the carriers in the drift layer 20 last long, the minority carriers when implanted from the wide well region 31 may also be diffused in the drift layer 20 located directly below the well regions 30 in the adjacent active region. In this case, to satisfy charge neutrality conditions, the electrons as the majority carriers are implanted from the substrate 10 to increase the density of the electrons, resulting in a decrease in resistivity of the drift layer 20. The decreased resistivity of the drift layer 20 reduces the voltage drop occurring in the drift layer 20 to increase the voltage applied to the p-n junction.

Therefore, in the outermost peripheral unit cells, the voltage applied to the p-n diode increases, and the bipolar operation starts at even lower voltage between the source and the drain. Furthermore, the bipolar operation in the outermost peripheral unit cells starts to cause the diffusion of the minority carriers also in the unit cells located closer to the inside. In this manner, the bipolar operation of the p-n diode in the wide well region 31 causes the bipolar operation in each of the unit cells from the unit cell adjacent to the wide well region 31 to the unit cell located closer to the inside of the active region. The effect is gradually diminished as it spreads to the unit cells located closer to the inside. Thus, the outermost peripheral cells have the lowest voltage between the source and the drain for causing each of the unit cells to start the bipolar operation, and the cells closer to the inside have more similar characteristics to the above-described characteristics in the case where the periodic arrangement of the unit cells endlessly continues.

As described above, for the application of the voltage between the source and the drain that exceeds the operating voltage of the p-n diode in the well region 30 in the outermost peripheral cells in the active region, the bipolar operation may cause the crystal defects in some of the unit cells close to the outermost peripheral cells in the active region to increase the ON resistance in the whole chip. The larger amount of reflux current that flows through the whole chip at the high driving voltage between the source and the drain extends a range in which the bipolar operation occurs. A density of the reflux current thus needs to be set to a fixed value or less in order to set the region where the crystal defects may occur to a fixed size or smaller. In this manner, however, the area of the chip increases, thereby increasing a cost of the chip.

In other words, the decrease in the operating voltage of the p-n diode in the unit cells in the active region can be suppressed by suppressing the operation of the p-n diode in the well regions 30 in the outermost peripheral cells. To achieve this, it is conceivably effective to reduce the potential difference between the well region 30 and the contact surface of the drift layer 20 with the well region 30 by sufficiently securing the unipolar current by the SBD directly below the well regions 30 in the outermost peripheral cells to increase the voltage drop in the drift layer 20.

The semiconductor device in this embodiment shown in FIGS. 5A, 5B, 6A, and 6B includes the SBD in the partially missing part of the wide well region 31 close to the well contact hole 91. When the voltage between the source and the drain is larger than the diffusion potential of the SBD, current flows from the SBD disposed close to the SBD contact hole 92 toward the silicon carbide layer. The current is horizontally diffused in the drift layer 20, causing the voltage drop not only in the area directly below the SBD contact hole 92 but also in the drift layer 20 located directly below the well regions 30 in the active region, the substrate 10, and the drift layer 20 and the substrate 10 close to the well contact hole 91 adjacent to the SBD contact hole 92. As a result, the voltage applied to the p-n junction close to the region having the SBD contact hole 92 is decreased by the amount of the voltage drop. Thus, the bipolar operation in the peripheral unit cells can be suppressed up to the higher voltage between the source and the drain.

Figure 9:
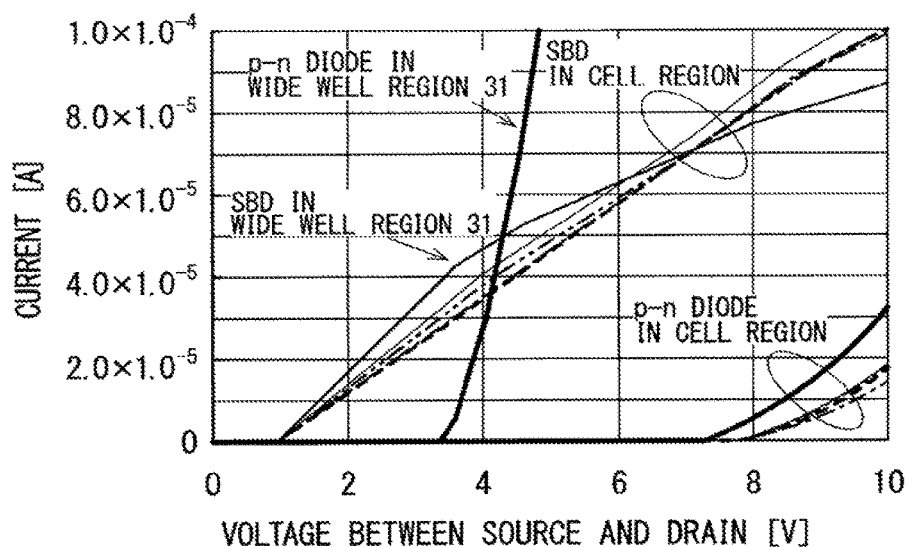
FIG. 9 is a diagram showing results of simulation that verify effects of embodiment.

FIG. 9 shows results, calculated by the device simulation, of current characteristics and voltage characteristics in the reflux state in the MOSFET with the built-in SBD including ten unit cells of the MOSFET with the built-in SBD, the wide well region 31, and the SBD that is positioned closer to the unit cell region than the first well contact region 35 in the wide well region 31 and that is formed in the partially missing part of the wide well region 31. The vertical axis indicates current (A) that flows through the drain electrode, and the horizontal axis indicates voltage between source and drain (V). Herein, a distance between the end portion of the outermost peripheral unit cell and the SBD formed in the partially missing part of the wide well region 31 is 5 μm, and a distance between the end portion of the outermost peripheral unit cell and the first well contact region 35 in the wide well region 31 is 20 μm. In FIG. 9, thick broken lines in the graph indicate results, calculated by the device simulation, of current characteristics and voltage characteristics in the reflux state only in the unit cells of the MOSFET with the built-in SBD, one broken line indicating the SBD in the cell region where current starts to flow at the voltage between the source and the drain of approximately 1 V, another broken line indicating the p-n diode in the cell region Where current starts to flow at the voltage between the source and the drain of approximately 8 V. Currents flowing through the SBDs in the ten cells located in the different positions are collectively indicated around the current flowing through the SBDs only in the unit cells. Currents flowing through the p-n diodes in the ten cells located in the different positions are collectively indicated around the current flowing through the p-n diodes only in the unit cells.

Figure 10:
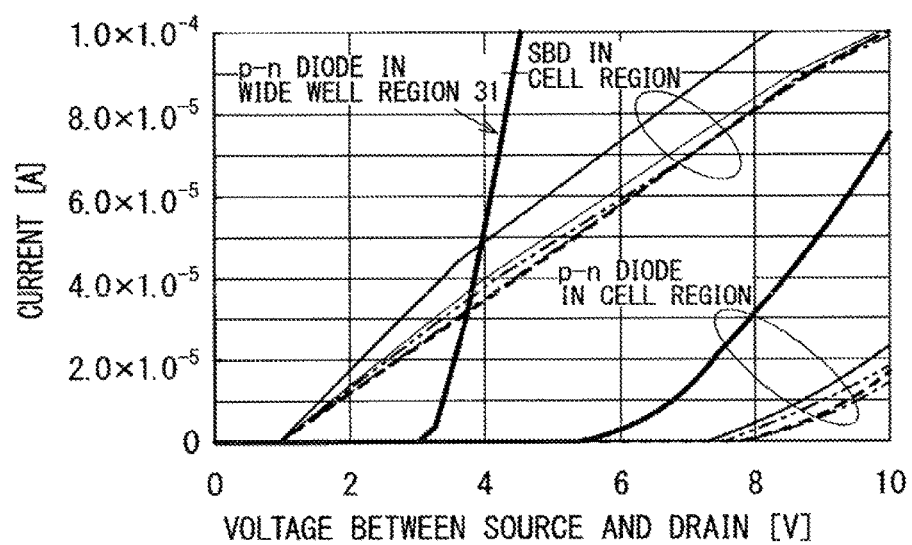
FIG. 10 is a diagram showing results simulation that verify effects of the embodiment.

FIG. 10 shows results, by the same calculation, of the MOSFET with the built-in SBD that does not include the SBD formed in the partially missing part of the wide well region 31. In FIG. 10, thick broken lines in the graph indicate results, calculated by the device simulation, of current characteristics and voltage characteristics in the reflux state only in the unit cells of the MOSFET with the built-in SBD, one broken line indicating the SBD in the cell region where current starts to flow at the voltage between the source and the drain of approximately 1 V, another broken line indicating the p-n diode in the cell region where current starts to flow at the voltage between the source and the drain of approximately 8 V. Currents flowing through the SBDs in the ten cells located in the different positions are collectively indicated around the current flowing through the SBDs only in the unit cells. Currents flowing through the p-n diodes in the ten cells located in the different positions are collectively indicated around the current flowing through the p-n diodes only in the unit cells.

The current that flows through the SBD in the cell region in the simulation diffuses toward the drift layer 20 located directly below the wide well region 31. Thus, the voltage drop is lower in the drift layer 20 than that in the case where only the unit cells of the MOSFET with the built-in SBD are simulated, thereby increasing the voltage applied to the SBD and the p-n diode. This effect is more significant in the cells located closer to the outer periphery. In FIGS. 9 and 10, the currents that each flow through the SBDs in the ten cells located in the different positions increase in the cell located closer to the outer periphery while a rising voltage of the p-n diodes in the ten cells located in the different positions decreases in the cell located closer to the outer periphery. The rising voltage of the p-n diode in the outermost peripheral cells is decreased to approximately 6 V in comparison with the case where only the unit cells are calculated (indicated by the thick broken line that the current starts to flow at approximately 8 V) in FIG. 10 while the rising voltage of the p-n diode in the outermost peripheral cells is highly maintained at approximately 8 V in FIG. 9.

Figure 11A:
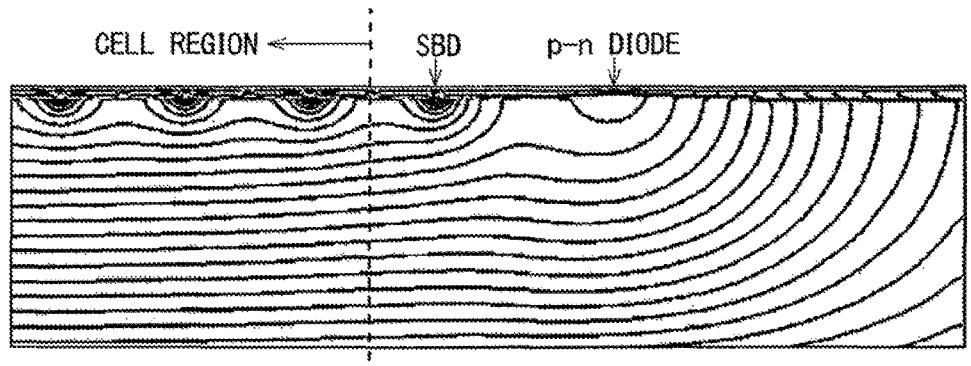
FIG. 11 is a diagram showing equipotential lines when voltage is applied between a source and a drain in the MOSFET.
Figure 11B:
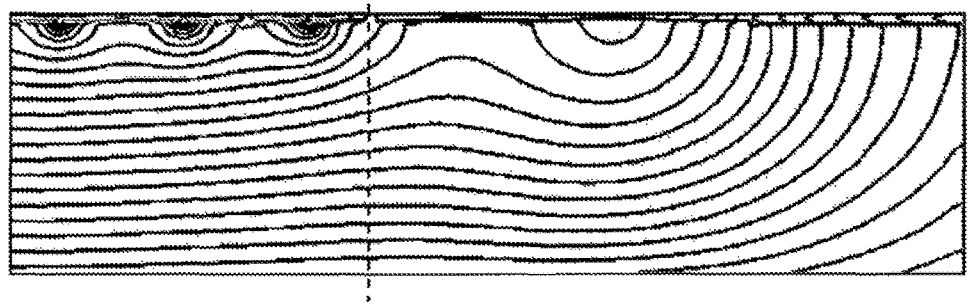

FIG. 11A shows equipotential lines when voltage of 6 V is applied between the source and the drain in the MOSFET with the built-in SBD including the ten unit cells of the MOSFET with the built-in SBD, the wide well region 31, the SBD that is positioned closer to the unit cell region than the first well contact region 35 in the wide well region 31 and that is formed in the partially missing part of the wide well region 31. FIG. 11B shows equipotential lines when voltage of 6 V is applied between the source and the drain in the MOSFET with the built-in SBD that does not include the SBD formed in the partially missing part of the wide well region 31.

In FIG. 11A, a current spreads from the SBD formed in the partially missing part of the wide well region 31 to the drift layer 20 that includes the lower portions of the well regions 30 in the outermost peripheral unit cells, causing the voltage drop in the lower portions of the well regions 30 in the outermost peripheral unit cells. Thus, the voltage applied to the p-n junction in the well regions 30 in the unit cells is smaller than that in the case of FIG. 11B. This allows a smaller degree of the drop in the rising voltage of the p-n diode in the well regions 30 in the unit cells. More specifically, the MOSFET with the built-in SBD includes the wide well region 31 and the SBD that is positioned closer to the unit cell region than the first well contact region 35 in the wide well region 31 and that is formed in the partially missing part of the wide well region 31, and thus the bipolar operation in the well regions 30 in the unit cells can be suppressed.

Figure 12:
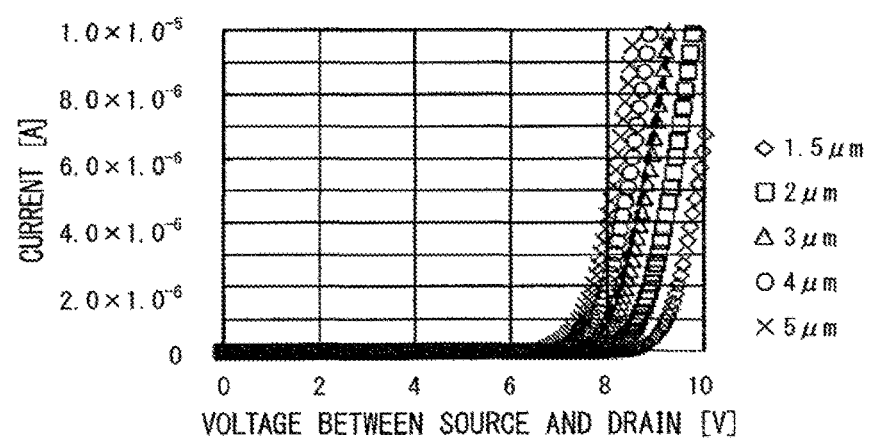
FIG. 12 is a diagram showing results, calculated by a device simulation, of current characteristics and voltage characteristics in a reflux state in the unit cell of the MOSFET with the built-in SBD.

FIG. 12 shows results, calculated by the device simulation, of current characteristics and voltage characteristics in the reflux state in the p-n diode in the well regions 30 in the outermost peripheral unit cells of the MOSFET with the built-in SBD including the ten unit cells of the MOSFET with the built-in SBD, the wide well region 31, and the SBD that is positioned closer to the unit cell region than the first well contact region 35 in the wide well region 31 and that is formed in the partially missing part of the wide well region 31. FIG. 12 shows the results in cases where a distance between the end portion of the outermost peripheral unit cell and the SBD formed in the partially missing part of the wide well region 31 is set in a range of 1.5 to 5 μm. In FIG. 12, rhombic marks indicate the case where the distance between the end portion of the outermost peripheral unit cell and the SBD formed in the partially missing part of the wide well region 31 is 1.5 μm, square marks indicate the case where the distance is 2 μm, triangular marks indicate the case where the distance is 3 μm, circular marks indicate the case where the distance is 4 μm, and crosses indicate the case where the distance is 5 μm. The broken lines in the graph indicate results of current characteristics and voltage characteristics in the reflux state in only the unit cells of the MOSFET with the built-in SBD.

As shown in FIG. 12, in the case where the distance between the end portion of the outermost peripheral unit cell and the SBD formed in the partially missing part of the wide well region 31, or the distance between each of the well regions 30 and the Schottky electrode 75 formed in the wide well region 31 is less than or equal to 3 μm, the rising voltage of the p-n diode m the well regions 34 in the outermost peripheral unit cells is greater than the rising voltage of the p-n diode in the well regions 30 when only the unit cells are calculated. In other words, the drop in the rising voltage of the p-n diode in the well regions 30 can be suppressed in all of the unit cells in the active region.

In this manner, it is better if the distance between the end portion of the outermost peripheral unit cell and the SBD formed in the partially missing part of the wide well region 31 is as short as possible, and preferably less than or equal to 3 µm, which can suppress the drop in the rising voltage of the p-n diode in the well regions 30 in the outermost peripheral unit cells. As already described, the decrease in the operating voltage of the p-n diode in the well regions 30 in all of the unit cells in the active region can be suppressed by suppressing the operation of the p-n diode in the well regions 30 in the outermost peripheral cells.

<Effects>

The effects of this embodiment are illustrated as follows.

According to this embodiment, the semiconductor device includes: the drift layer 20 of the first conductivity type; the well regions 30 serving as first well regions of the second conductivity type; the wide well region 31 serving as a second well region of the second conductivity type; the first separation region 22 of the first conductivity type; the source region 40 of the first conductivity type; the Schottky electrode 75 serving as a first Schottky electrode located on the first separation region 22; the ohmic electrode 70 serving as a first ohmic electrode located over each of the well regions 30 and located on the source region 40 while contacting each of the well regions 30 and the source region 40; the second separation region 21 of the first conductivity type; the ohmic electrode 70 serving as a second ohmic electrode located over the wide well region 31; the third separation region 23 of the first conductivity type; the Schottky electrode 75 serving as a second Schottky electrode located on the third separation region 23; the gate electrode 60; the interlayer insulating film 55 serving as a second insulating film: and the source electrode 80.

The drift layer 20 is formed on the substrate 10 serving as a semiconductor substrate of the first conductivity type. The plurality of well regions 30 are located at an interval in the surface layer of the drift layer 20.

The wide well region 31 is formed on both sides, as seen in the plan view, of the entirety of the plurality of the well regions 30 in the surface layer of the drift layer 20. The wide well region 31 has a formation area larger than that of each of the well regions 30.

The first separation region 22 is formed to penetrate each of the well regions 30 from the surface layer of each of the well regions 30 in the depth direction. The source region 40 is formed on both sides, as seen in the plan view, of the first separation region 22 in the surface layer of each of the well regions 30.

The second separation region 21 is a region for separating the well regions 30 from each other. The third separation region 23 is positioned closer to the well regions 30 than the ohmic electrode 70 serving as the second ohmic electrode in the wide well region 31 and is formed to penetrate the wide well region 31 from the surface layer of the wide well region 31 in the depth direction.

The gate electrode 60 is located, through the gate insulating film 50 serving as the first insulating film, over part of the well regions 30 and the wide well region 31 except for the positions in which the Schottky electrode 75 and the ohmic electrode 70 are located.

The interlayer insulating film 55 is formed so as to cover the gate electrode 60. The source electrode 80 is located so as to cover the Schottky electrode 75, the ohmic electrode 70, and the interlayer insulating film 55.

Such a configuration allows the MOSFET with the built-in SBD to include the wide well region 31 and the SBD that is positioned closer to the unit cell region than the first well contact region 35 in the wide well region 31 and that is formed in the partially missing part of the wide well region 31. This can suppress the decrease in the operating voltage of the p-n diode in the well regions 30 in the unit cells in the active region (particularly, the p-n diode in the outermost peripheral unit cells in the active region). For this reason, a larger amount of current can be refluxed in the SBD to increase the reflux current that flows as the unipolar current through the whole chip, allowing a reduced size of the chip and a reduced cost of the chip resulting from the reduced size.

Configurations except for the configurations above can be appropriately omitted, and the same effects can be obtained even if any configuration in this specification is appropriately added.

According to this embodiment, the distance between the Schottky electrode 75 serving as the second Schottky electrode and each of the well regions 30 is less than or equal to 3 µm.

Such a configuration can increase the current that flows from the SSD located in the wide well region 31 to the drift layer 20 directly below the outermost peripheral cells in the reflux state, and thus the voltage drop can be more increased. This can suppress the operation of the p-n diode in the outermost peripheral cells.

Second Embodiment

<Configuration>

Figure 13:
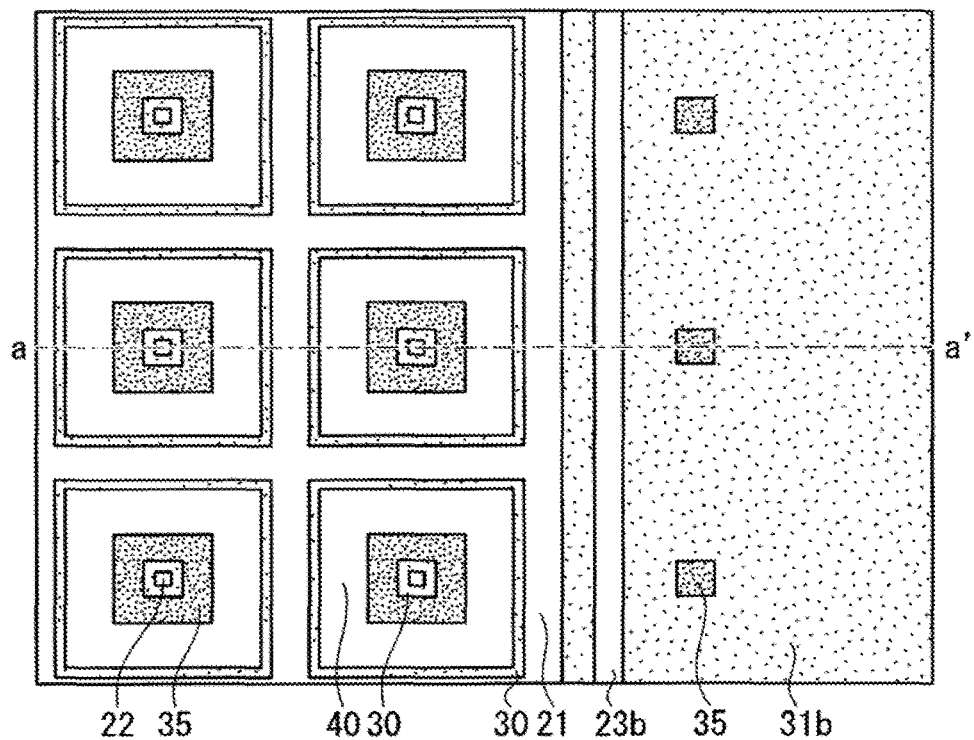
FIG. 13 is a schematic plan view of a semiconductor device according to the embodiment.
Figure 14:
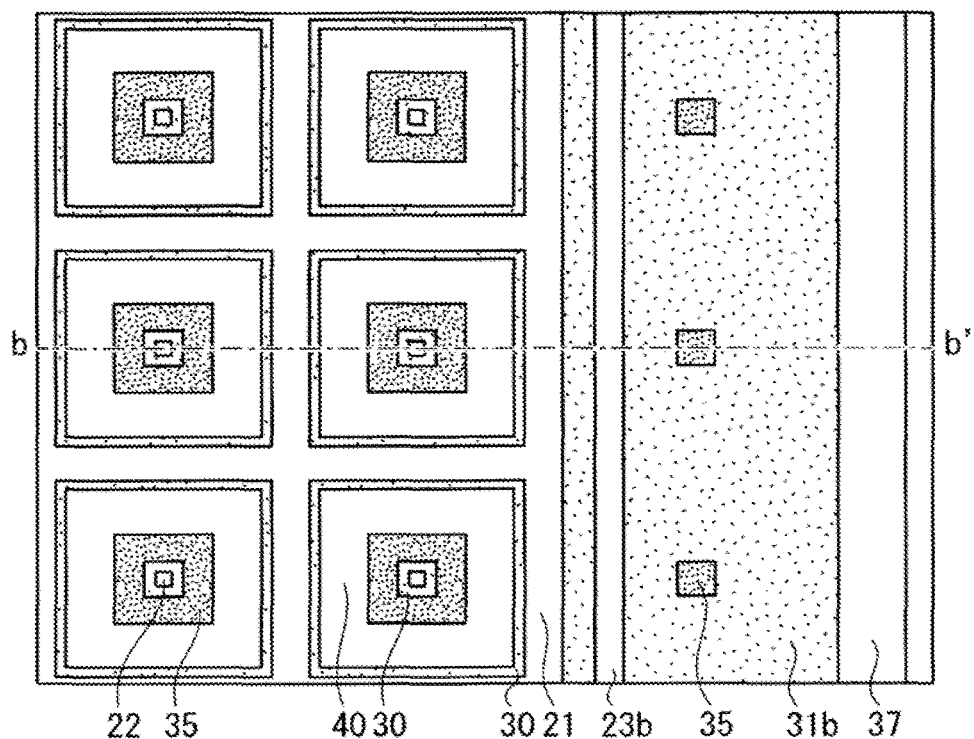
FIG. 14 is a schematic plan view of the semiconductor device according to the embodiment.

FIG. 13 is a schematic plan view for describing a structure of a portion, which is adjacent to the gate electrode 82, of the termination of the active region, and FIG. 13 corresponds to the position of a-a' in FIG. 4. FIG. 13 shows only the semiconductor region without showing the electrode, the insulating film, or the like. FIG. 14 is a schematic plan view for describing a structure of a portion, which does not include the gate electrode 82 and is adjacent to the termination of the chip, of the termination of the active region, and FIG. 14 corresponds to the position of b-b' in FIG. 4. FIG. 14 shows only the semiconductor region without showing the electrode, the insulating film, or the like.

In FIGS. 13 and 14, a third separation region 23b is a partially missing part of the wide well region 31b between each of the well regions 30 in the outermost peripheral unit cells and the first well contact region 35 in the wide well region 31b and is formed so as to surround the active region. Although it is not shown, the Schottky electrode 75 is formed on the surface of the third separation region 23b to allow the passage of the unipolar current during the reflux operation.

In this manner, the SBD region in the wide well region 31b is continuously formed so as to surround the active region, or formed in a direction that intersects a direction from the wide well region 31b toward the well regions 30 in the plan view, to thereby allow the unipolar current to uniformly pass from the SBD in the wide well region 31b to the drift layer 20 below the well regions 30 in the unit cells. Thus, the unipolar current does not vary according to the plan positions, and the decrease in the operating voltage of the p-n diode in the outermost peripheral unit cells can be suppressed.

Figure 15:
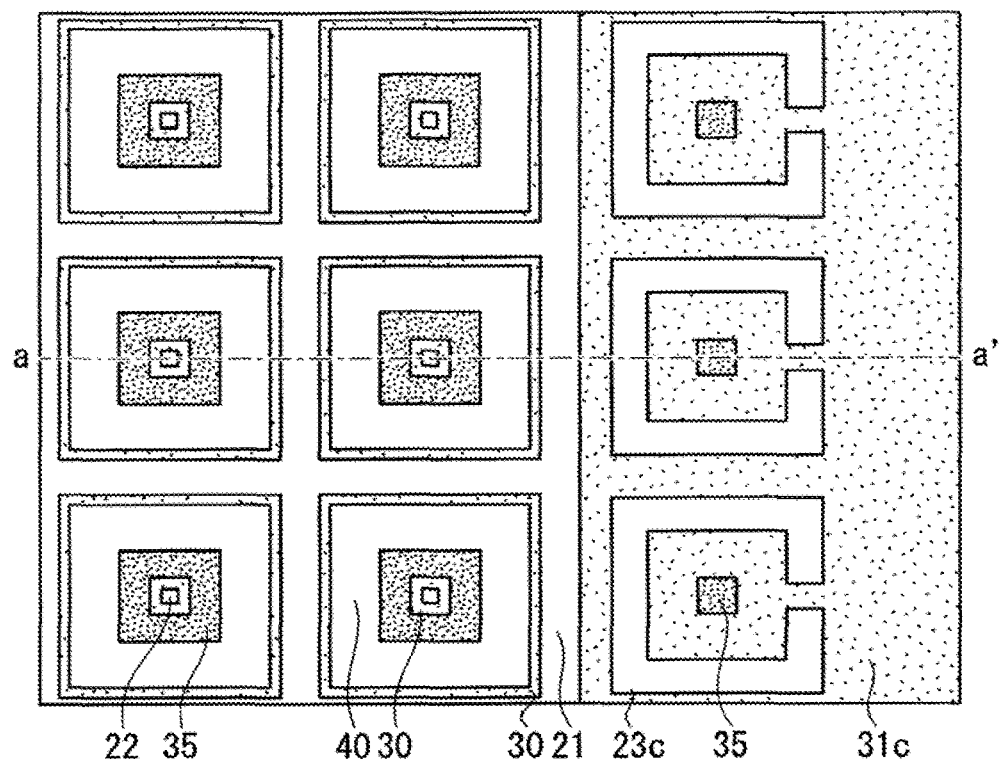
FIG. 15 is a schematic plan view of the semiconductor device according to the embodiment.
Figure 16:
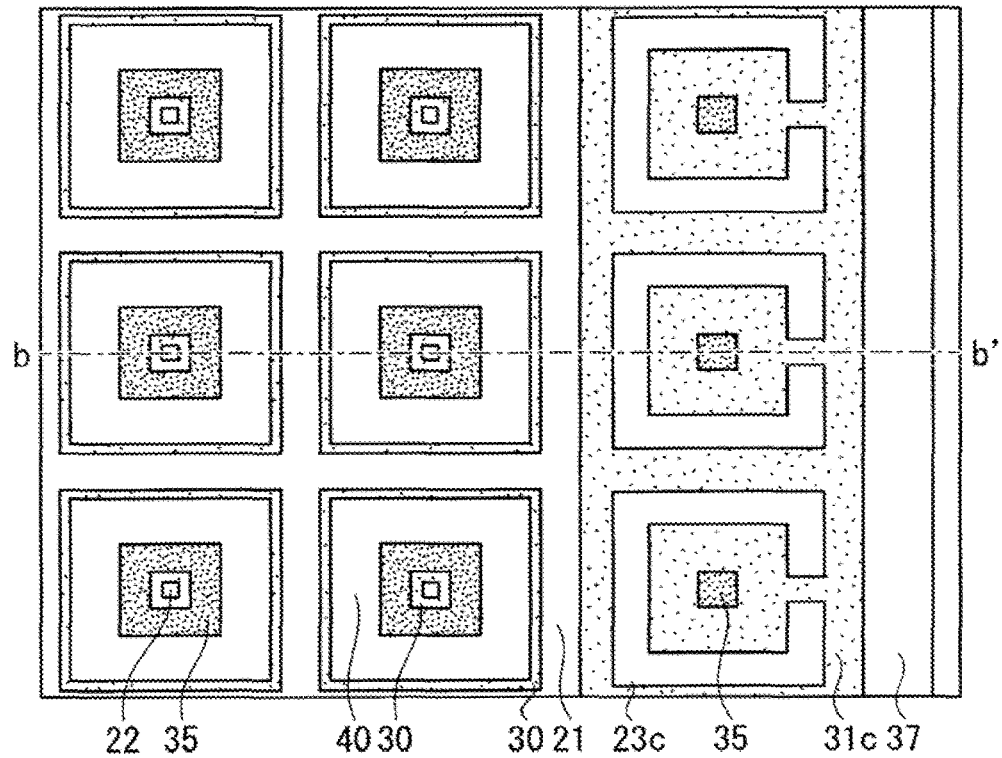
FIG. 16 is a schematic plan view of the semiconductor device according to the embodiment.

An excessive increase in the area of the SBD region in the MOSFET with the built-in SBD increases the leak current in the OFF state. For this reason, to reduce the SBD region in the MOSFET with the built-in SBD, a plurality of third separation regions 23c that are partially missing parts of a wide well region 31c formed so as to surround the active region may be discretely formed as shown in FIGS. 15 and 16 (which will be described in a third embodiment in detail).

<Effects>

The effects of this embodiment are illustrated as follows.

According to this embodiment, the third separation region 23b is continuously formed in the direction that intersects the direction toward the well regions 30 serving as the first well regions in the plan view.

Such a configuration allows the unipolar current to uniformly pass from the SBD in the wide well region 31b to the drift layer 20 below the well regions 30 in the unit cells. Thus, the unipolar curt-cut does not vary according to the plan positions, and the decrease in the operating voltage of the p-n diode in the well regions 30 in the unit cells in the active region (particularly, the p-n diode in the outermost peripheral unit cells in the active region) can be suppressed. For this reason, a larger amount of current can be refluxed in the SBD to increase the reflux current that flows as the unipolar current through the whole chip, allowing a reduced size of the chip and a reduced cost of the chip resulting from the reduced size.

In this embodiment, the differences between the first embodiment and this embodiment are described while descriptions of the same or corresponding components are omitted.

Third Embodiment

<Configuration>

FIG. 15 is a schematic plan view for describing a structure of a portion, which is adjacent to the gate electrode 82, of the termination of the active region, and FIG. 15 corresponds to the position of a-a' in FIG. 4. FIG. 15 shows only the semiconductor region without showing the electrode, the insulating film, or the like. FIG. 16 is a schematic plan view for describing a structure of a portion, which does not include the gate electrode 82 and is adjacent to the termination of the chip, of the termination of the active region, and FIG. 16 corresponds to the position of b-b' in FIG. 4. FIG. 16 shows only the semiconductor region without showing the electrode, the insulating film, or the like.

In FIGS. 15 and 16, the third separation region 23c is the partially missing part of the wide well region 31c located in an area around the first well contact region 35 in the wide well region 31c, the area including a portion between each of the well regions 30 in the outermost peripheral unit cells and the first well contact region 35 in the wide well region 31c. The third separation region 23c does not completely surround the first well contact region 35. Although it is not shown, the Schottky electrode 75 is formed on the surface of the third separation region 23c to allow the passage of the unipolar current during the reflux operation.

Thus, the unipolar current flows through the drift layer 20 around the first well contact region 35 in the wide well region 31c during the reflux operation, causing the voltage drop. This results in the reduced voltage applied to the p-n junction around the first well contact region 35 in the wide well region 31c, and thus the decrease in the operating voltage of the p-n diode can be suppressed.

The third separation region 23c does not completely surround the first well contact region 35 in the wide well region 31c, which can keep a path through which displacement current flows even in a case of application of high dV/dt during, for example, a switching operation.

Figure 17:
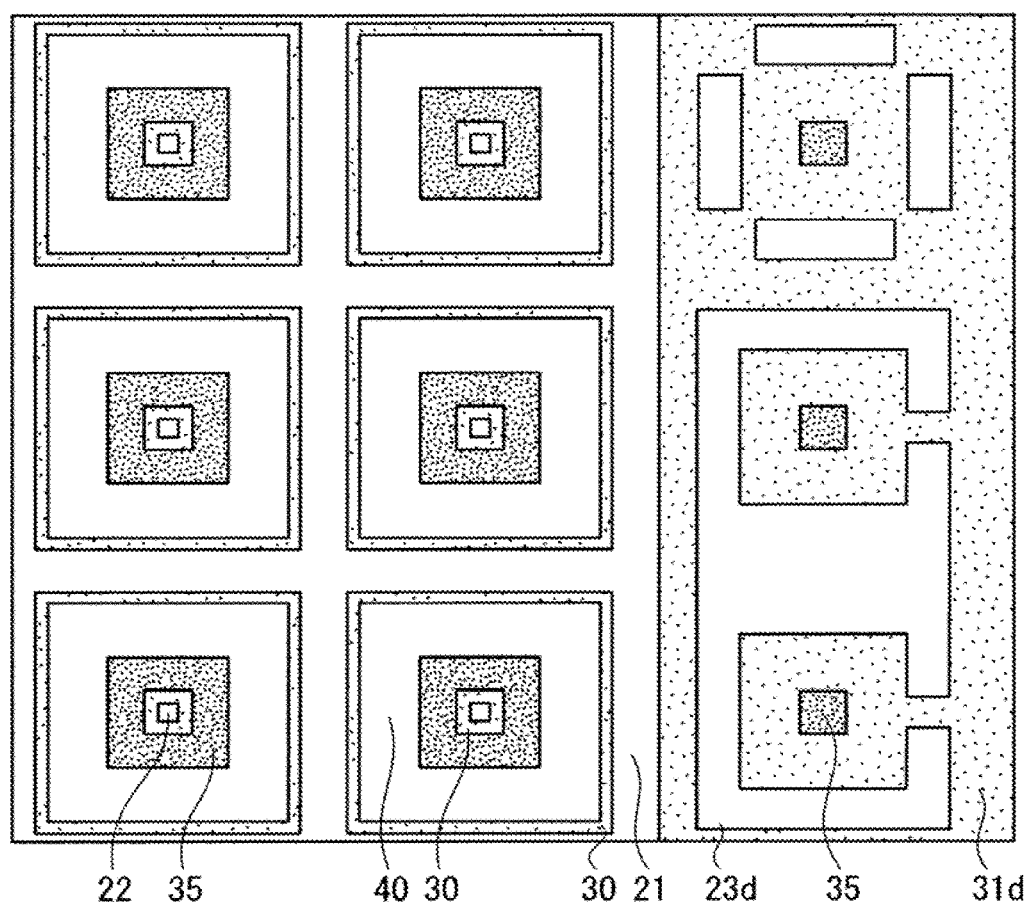
FIG. 17 is a schematic plan view of the semiconductor device according to the embodiment.

As long as the third separation region 23c does not completely surround the first well contact region 35 in the wide well region 31c, a plurality of third separation regions 23d may be discretely formed or the third separation regions 23d adjacent to each other may be connected to each other, as shown in FIG. 17.

<Effects>

The effects of this embodiment are illustrated as follows.

According to this embodiment, the third separation region 23c surrounds the ohmic electrode 70 serving as the second ohmic electrode in the plan view and at least part of the portion that surrounds the ohmic electrode 70 is missing.

Such a configuration allows the unipolar current to pass through the drift layer 20 around the first well contact region 35 in the wide well region 31c (located below the ohmic electrode 70) during the reflux operation, causing the voltage drop. This results in the reduced voltage applied to the p-n junction around the first well contact region 35 in the wide well region 31c, and thus the decrease in the operating voltage of the p-n diode can be suppressed. As a result, conductivity modulation due to the bipolar current that flows from the p-n diode in the wide well region 31c to the drift layer 20 directly below the well regions 30 in the unit cells is suppressed, and the voltage drop occurring in the drift layer 20 directly below the well regions 30 in the unit cells can be sufficiently maintained to suppress the decrease in the operating voltage of the p-n diode in the well regions 30 in the unit cells.

For this reason, a larger amount of current can be refluxed in the SBD to increase the reflux current that flows as the unipolar current through the whole chip, allowing a reduced size of the chip.

The third separation region 23c does not completely surround the first well contact region 35 in the wide well region 31c, which can keep a path through which displacement current flows even in the case of the application of high dV/dt during, for example, the switching operation.

In this embodiment, the differences between the first embodiment and this embodiment are described while descriptions of the same or corresponding components are omitted.

Fourth Embodiment

<Configuration>

Figure 18A:
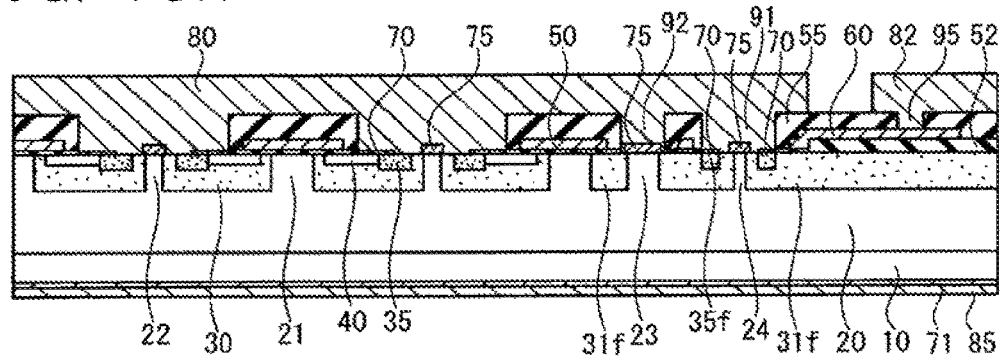
FIG. 18 is a schematic plan view of the semiconductor device according to the embodiment.
Figure 18B:
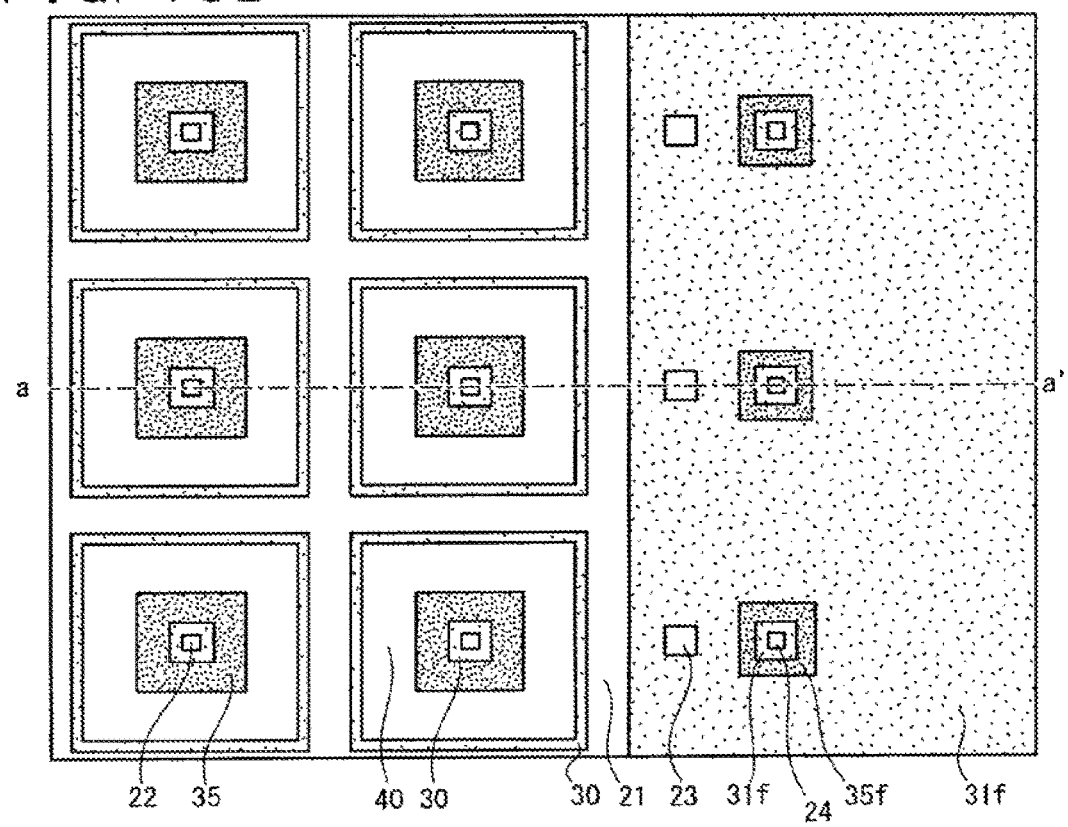

FIG. 18A is a schematic cross-sectional view for describing a structure of a portion, which is adjacent to the gate electrode 82, of the termination of the active region, and FIG. 18A corresponds to the position of a-a' in FIG. 4. FIG. 18B is a schematic plan view of the portion in FIG. 18A, and shows only the semiconductor region without showing the electrode, the insulating film, or the like.

Figure 19A:
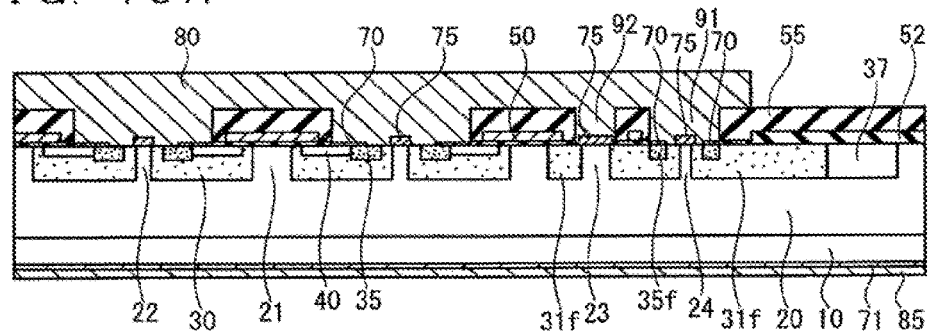
FIG. 19 is a schematic plan view of the semiconductor device according to the embodiment.
Figure 19B:
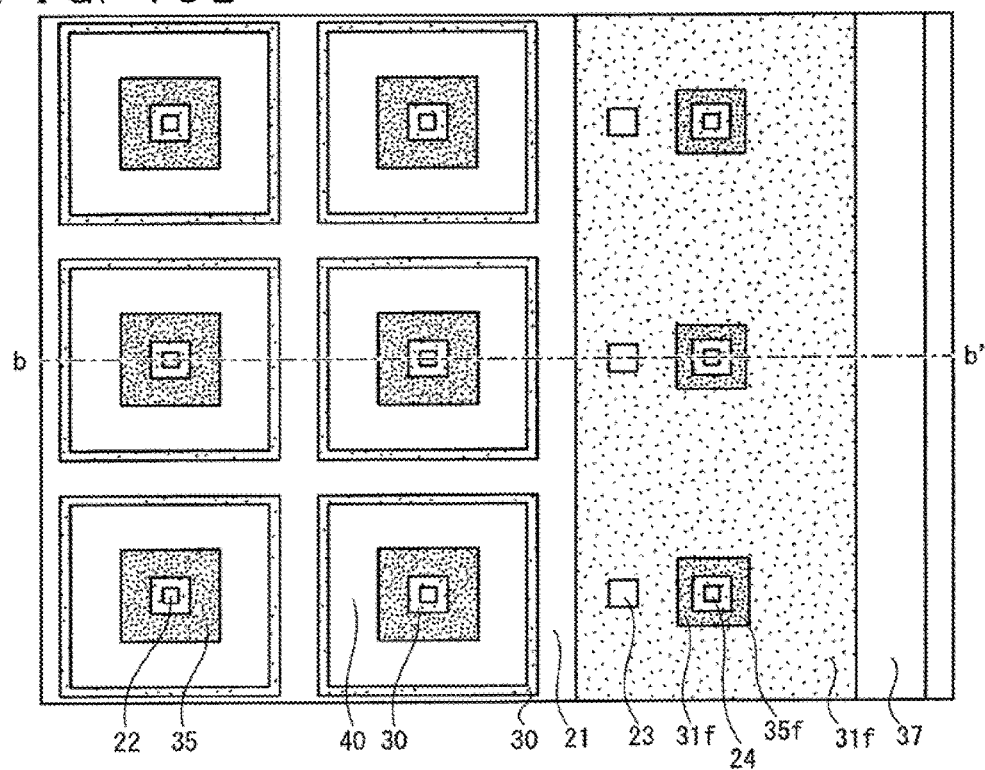

FIG. 19A is a schematic cross-sectional view for describing a structure of a portion, which does not include the gate electrode 82 and is adjacent to the termination of the chip, of the termination of the active region, and FIG. 19A corresponds to the position of b-b' in FIG. 4. FIG. 19B is a schematic plan view of the portion in FIG. 19A, and shows only the semiconductor region without showing the electrode, the insulating film, or the like.

In FIGS. 18 and 19, the third separation region 23 is a partially missing part of a wide well region 31f formed between each of the well regions 30 in the outermost peripheral unit cells and a first contact well region 35f in the wide well region 31f. The Schottky electrode 75 is formed on the surface of the third separation region 23 to allow the passage of the unipolar current during the reflux operation.

A fourth separation region 24 is formed in the first well contact region 35f in the wide well region 31f. Further, the Schottky electrode 75 that contacts at least part of the surface of the fourth separation region 24 and the ohmic electrode 70 that contacts at least part of the surface of the first well contact region 35f are formed. The Schottky electrode 75 and the ohmic electrode 70 contact the source electrode 80 through the well contact hole 91.

The manufacturing method, which is almost the same as that in the first embodiment, only needs to modify implantation positions of the wide well region 31f and the first well contact region 35f and modify a mask layout to dispose the ohmic electrode 70 and the Schottky electrode 75 in desired positions.

<Effects>

The effects of this embodiment are illustrated as follows.

According to this embodiment, the semiconductor device includes the fourth separation region 24 and the Schottky electrode 75 serving as a third Schottky electrode.

The fourth separation region 24 is a region of the first conductivity type formed to penetrate the wide well region 31f serving as a second well region from the surface layer of the wide well region 31f in the depth direction. The Schottky electrode 75 is an electrode located on the fourth separation region 24.

The ohmic electrode 70 serving as a second ohmic electrode is located over the wide well region 31f.

Such a configuration allows the MOSFET with the built-in SBD to include the wide well region 31f and the SBD that is positioned closer to the unit cell region than the first well contact region 35f in the wide well region 31f and that is formed in the partially missing part of the wide well region 31f so as to surround the active region. Such a configuration allows the MOSFET with the built-in SBD to further include the SBD in the first well contact region 35f in the wide well region 31f. The unipolar current thus flows through the SBD built in the first well contact region 35f in the wide well region 31f until the p-n diode in the wide well region 31f operates. Therefore, the unipolar current flows through the drift layer 20 directly below the first well contact region 35f in the wide well region 31f during the reflux operation, causing the voltage drop. This results in the reduced voltage applied to the p-n junction around the first well contact region 35f in the wide well region 31f, and thus the decrease in the operating voltage of the p-n diode in the wide well region 31f can be suppressed.

As a result, conductivity modulation due to the bipolar current that flows from the p-n diode in the wide well region 31f to the drift layer 20 directly below the well regions 30 in the unit cells is suppressed, and the voltage drop occurring in the drift layer 20 directly below the well regions 30 in the unit cells can be sufficiently maintained to suppress the decrease in the operating voltage of the p-n diode in the well regions 30 in the unit cells.

For this reason, a larger amount of current can be refluxed in the SBD to increase the reflux current that flows as the unipolar current through the whole chip, allowing a reduced size of the chip.

In this embodiment, the differences between the first embodiment and this embodiment are described while descriptions of the same or corresponding components are omitted.

Fifth Embodiment

<Configuration>

In this embodiment, a MOSFET with a built-in SBD that includes a built-in current sense is described as an example.

First, a structure and functions of the current sense are described. FIG. 20 is a diagram when seen from above the MOSFET with the built-in SBD on which the built-in current sense is installed or when seen from the first main surface side. FIG. 20 indicates a plan position of the active region by broken lines.

In the MOSFET with the built-in SBD that includes the current sense, a sense electrode 81 separated from a source electrode 80a in the plan view is formed on the first main surface. The active region including the unit cells arranged in the same layout as that in part of the source electrode 80a is formed in part of the sense electrode 81. It is assumed that the source electrode 80 is replaced with the sense electrode 81 in the cross-sectional view of the unit cell, which is the same as that of the unit cell located below the source electrode 80 shown in FIG. 2. The sense electrode 81 covers the Schottky electrode 75 formed on the first separation region 22 and the ohmic electrode 70 formed in the well region and the source region.

Hereinafter, the unit cells included in the active region below the source electrode 80a are referred to as main cells while the unit cells included in the active region below the sense electrode 81 are referred to as sense cells. The gate electrode 60 and the drain electrode 85 in the main cell are electrically short-circuited to a corresponding electrode in the sense cell and are at the same potential. The sense electrode 81 also operates at substantially 0 volt, which is almost the same volt that operates the source electrode 80a.

It is thus conceivable that the same current always flows through the one main cell and the one sense cell. The number of sense cells is significantly lower than the number of main cells, for example, one ten-thousandth. The current flowing through the small number of unit cells is measured through a shunt resistor or the like, and the current value is multiplied by a ratio of the number of cells, so that the current flowing through the source electrode can be estimated. Particularly in a case where an overcurrent flows through the element in the ON state, an OFF signal is provided to the gate electrode 82 upon the detection of the overcurrent in order to prevent the element from being thermally destroyed. This is the advantage in building in the current sense.

Figure 21:
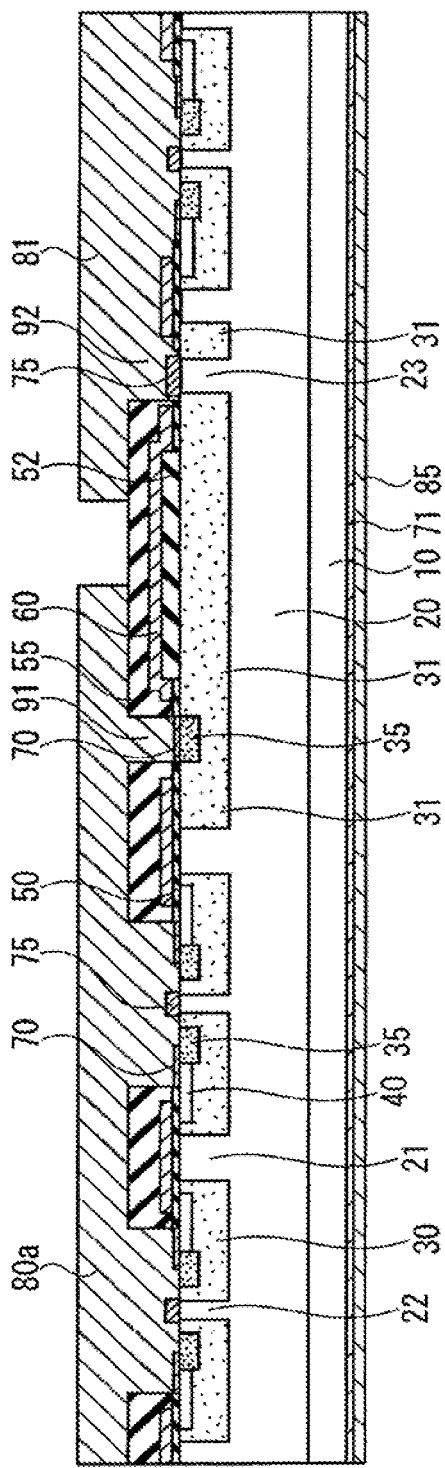
FIG. 21 is a schematic cross-sectional view of the semiconductor device according to the embodiment.
Figure 22:
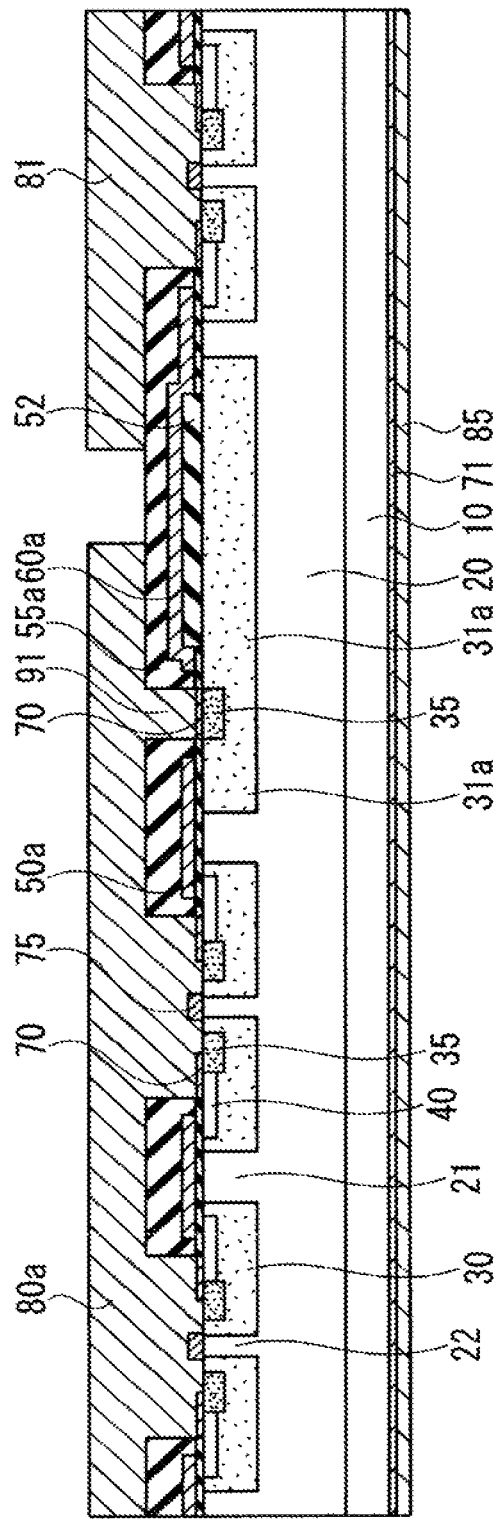
FIG. 22 is a schematic cross-sectional view of the semiconductor device without the use of the present invention.

FIG. 21 is a schematic cross-sectional view of a region from an end portion of the arrangement of the main cells to an end portion of the arrangement of the sense cells. FIG. 22 is a schematic cross-sectional view of the region without the use of the present invention. Both of them are the schematic cross-sectional views corresponding to a portion of c-c' in FIG. 20.

A region sandwiched between the two active regions includes a gate electrode that connects the two active regions and the gate insulating film 50 or the field insulating film 52 below the gate electrode. As described above, the structure in this embodiment can prevent the application of high electric field to the gate insulating film 50 and the field insulating film 52 in the OFF state.

In the structure of this embodiment, the main cells and the sense cells are separated by the wide well region 31, and the third separation region 23 is formed as the partially missing part of the wide well region 31 close to the sense cells. The wide well region 31 is formed on both sides, as seen in the plan view, of the entirety of the sense cells, which correspond to some of the plurality of well regions 30, in the surface layer of the drift layer 20. The wide well region 31 is formed on both the sides, as seen in the plan view, of the entirety of the sense cells to separate the sense cells from the other well regions 30. The third separation region 23 is formed closer to the sense cells than the ohmic electrode 70 in the wide well region 31. The Schottky electrode 75 is formed such that at least part of the Schottky electrode 75 contacts the third separation region 23. The Schottky electrode 75 is connected to the sense electrode 81 through the SBD contact hole 92 that penetrates the interlayer insulating film 55 and the gate insulating film 50. In the structure shown in FIG. 22, the wide well region 31a has no missing part and no SBD contact hole 92, so that an interlayer insulating film 55a and a gate electrode 60a are formed in the above-described portions.

The manufacturing method, which is almost the same as that in the first embodiment, only needs to modify each mask layout. The sense electrode 81 can be formed simultaneously with the source electrode 80a and the gate electrode 82, that is to say, the sense electrode 81 can be formed by depositing a metal material once, patterning with a photoresist, and etching.

In a case where the distance between the well region 30 and the Schottky electrode 75 formed in the wide well region 31 is less than or equal to 3 μm, similarly to the case shown in FIG. 12, the drop in rising voltage of the p-n diode in the well region 30 can be suppressed.

Similarly to the case shown in FIGS. 13 and 14, the third separation region may be continuously formed in the direction that intersects the direction from the wide well region toward the sense region in the plan view.

<Effects>

The effects of this embodiment are illustrated as follows.

According to this embodiment, the semiconductor device includes the sense region (sense cell) and the sense electrode 81.

The sense cell is a region that includes at least one well region 30 of the plurality of well regions 30 and that is separated from another well region 30 of the well regions 30 by the wide well region formed on both the sides, as seen in the plan view, of the sense cell.

The sense electrode 81 is located so as to cover the Schottky electrode 75 serving as a first Schottky electrode formed on the first separation region 22 in the sense cell and cover the ohmic electrode 70 serving as a first ohmic electrode formed on the sense cell and the source region 40. The sense electrode 81 is a different electrode from the source electrode 80.

Such a configuration allows the SBD located between the sense cell and the ohmic electrode in the wide well region to cause the voltage drop even in the drift layer directly below the sense cell, and thus the operation of the p-n diode in the sense cell can be suppressed.

This effect is achieved by forming the SBD in the partially missing part of the wide well region 31 close to the sense cell and by connecting the Schottky electrode 75 to the sense electrode 81 instead of the source electrode 80 to dispose the SBD closer to the sense cell.

It can be described that it is effective to dispose the SBD in the position closer to the sense cell, resulting from the mechanism in which the forward voltage applied to the p-n diode close to the SBD is reduced by the unipolar current that flows front the SBD disposed in part of the wide well region 31 and that causes the voltage drop directly below the SBD and in the drift layer 20 and the substrate 10 close to the portion directly below the SBD diode, as described above.

The occurrence of crystal defects in the sense cell is particularly deleterious in comparison with the occurrence of crystal defects in the main cell. The reason is that the number of cells for the current sense is significantly lower than the number of main cells and that the resistance in the whole active region more greatly changes in the current sense even if the crystal defects having the same area occur. The current flowing through the source electrode 80 fails to be properly estimated due to the change in the resistance in the current sense, and an OFF signal fails to be properly transmitted to the gate electrode 60 upon a flow of overcurrent, thereby increasing the risk of breaking the element.

This embodiment can provide the semiconductor device with higher reliability that suppresses a change in the ON resistance in the sense cell.

The descriptions above describe that the reduced occurrence of the crystal defects in the sense cell. Further, the reduced occurrence of the crystal defects is also important for the main cell.

Figure 23:
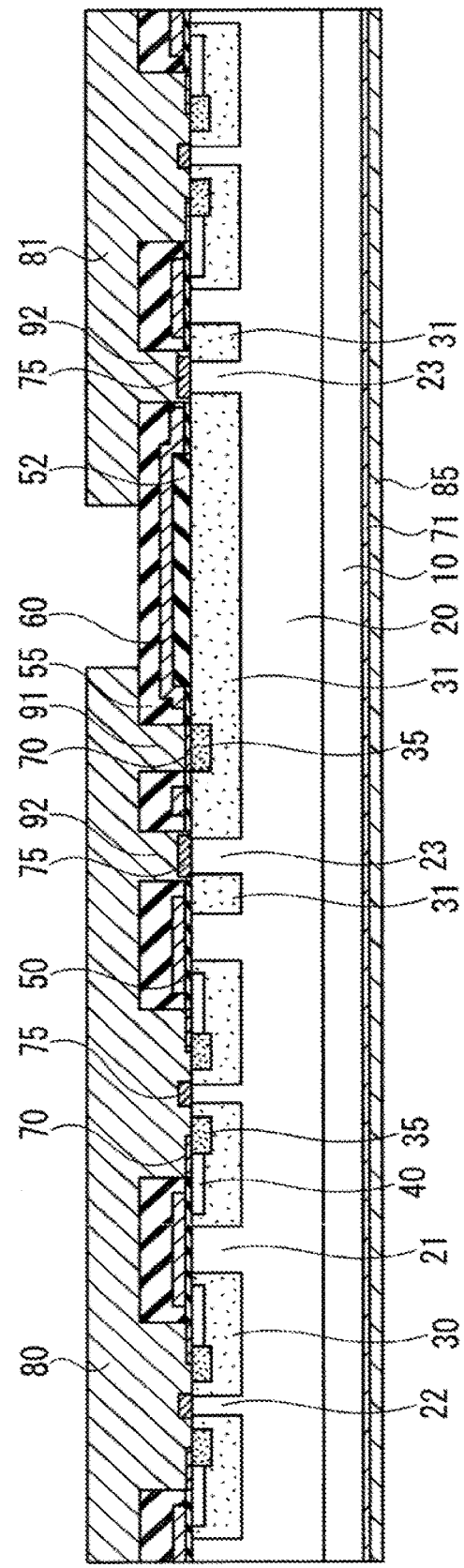
FIG. 23 is a schematic cross-sectional view of the semiconductor device according to the embodiment.

FIG. 23 is a schematic cross-sectional view corresponding to the portion of c-c' in FIG. 20. As shown in FIG. 23, it is also effective that the SBDs formed in the wide well region 31 close to the main cell and the sense cell are respectively connected to the source electrode 80 and the sense electrode 81.

The current flowing through the sense cells is usually small aid has a small capacity, so that the sense cells are more likely to break than the main cells due to discharge caused by electrostatic or the like. For this reason, the structure may include the higher number of unit cells for a higher capacity and include the well region 30 instead of the second separation region 21 in at least one of the sense cells in order to lower a current value to a desired value, or may not include the source region 40 in at least one of the sense cells. Also in these cases, the unit cell may include the SBD in the third separation region 23.

In this embodiment, the differences between the first embodiment and this embodiment are described while descriptions of the same or corresponding components are omitted.

<Modifications>

The embodiments described above use nitrogen as the n-type (first conductivity type) impurity, which may be phosphorus or arsenic.

The embodiments described above use aluminum as the p-type (second conductivity type) impurity, which may be boron or gallium.

The embodiments described above give the descriptions with the particular examples of, for example, the crystal structure, the plane direction of the main surface, the off-angle, and respective implantation condition, but the applicability is not limited to a range of these numerical values.

The embodiments described above describe that the semiconductor element of silicon carbide is particularly effective, but the other wide gap semiconductor elements are also effective, and semiconductor elements of silicon also have a certain degree of effectiveness.

In the embodiments described above, the first well contact region 35 is formed in the area that contacts the ohmic electrode 70 in the wide well region 31, but the first well contact region 35 may not be formed in the area.

The embodiments described above describe the case in which the n-channel MOSFET is used, but a p-channel MOSFET in which a first conductivity type is the p-type and a second conductivity type is the n-type may be used.

The present invention is also applicable to MOSFETs with a super junction structure.

The embodiments described above use silicon carbide for the gate insulating film, which may be a deposition film by a CVD.

The embodiments described above describe the so-called vertical MOSFET including the drain electrode 85 formed on the back surface of the substrate 10, but the embodiments are also applicable to a so-called lateral MOSFET such as a RESURF MOSFET including the drain electrode 85 formed on the front surface of the drift layer 20.

The embodiments described above describe the MOSFET including the gate insulating film 50, but the present invention is also applicable to a unipolar device such as a junction field effect transistor (JFET) and a metal-semiconductor field effect transistor (MESFET) that do not include the gate insulating film 50.

In the embodiments described above, the source-side ohmic electrode 70 and the Schottky electrode 75 are manufactured separately, but they may be continuously made of the same material or different materials.

The embodiments described above describe the example of the unit structure having the shape of the square cell as shown in, for example, FIG. 2, but the unit structure may have a hexagonal shape, and may also have a stripe shape such that the sectional structure in FIG. 1, for example, continues in the depth direction.

The semiconductor device described in the embodiments above may be used for electric power, electric railroads, automobiles, household electrical appliances, solar cells, and communication, for example.

Materials, dimensions, shapes, and relative positions of respective structural components and execution conditions described in the embodiments described above are in all aspects illustrative and not restrictive. It is therefore understood that numerous modifications and variations can be devised without departing from the scope of the invention. For example, a freely-selected structural component may be modified, added, or omitted, and furthermore, at least one structural component in at least one embodiment may be extracted and combined with a structural component in another embodiment.

A structural component described as "one" structural component in the respective embodiment described above may comprise "one or more" structural components as long as it is not inconsistent. Furthermore, structural components that construct the invention are conceptual units, so that one structural component may have a plurality of structures and may correspond to part of a structure. The respective structural component of the present invention may have a structure having the other structure or shape as long as the same functions are achieved.

It is denied based on all the descriptions, which are references for all purposes of the present invention, in the present application that the present invention is a conventional technology.

DESCRIPTION OF NUMERALS

10 substrate; 20 drift layer; 21 second separation region; 22 first separation region; 23, 23b, 23c, 23d third separation region; 24 fourth seperation region; 30 well region; 31, 31a, 31b, 31c, 31f wide well region; 35, 35f first well contact region; 37 JTE region; 40 source region; 50 gate insulating film; 52 field insulating film; 55, 55a interlayer insulating film; 60, 60a, 82 gate electrode; 70 ohmic electrode; 71 back surface ohmic electrode; 75 Schottky electrode; 80, 80a source electrode; 81 sense electrode; 85 drain electrode; 91 well contact hole; 92 SBD contact hole; 95 gate contact hole.

The invention claimed is:

1. A semiconductor device, comprising:
    a drift layer of a first conductivity type formed on a semiconductor substrate of the first conductivity type;
    a plurality of first well regions of a second conductivity type located at a interval in a surface layer of said drift layer;
    a second well region of the second conductivity type formed on both sides, as seen in plan view, of the entirety of said, plurality of first well regions in the surface layer of said drift layer, said second well region having a formation area larger than that of each of said first well regions;
    a first separation region of the first conductivity type formed to penetrate each of said first well regions from a surface layer of each of said first well regions in a depth direction;
    a source region of the first conductivity type formed on both sides, as seen in plan view, of said first separation region in the surface layer of each of said first well regions;
    a first Schottky electrode located on said first separation region;
    a first ohmic electrode (70) located over each of said first well regions and located on said source region while contacting each of said first well regions and said source region;
    a second separation region of the first conductivity type being a region for separating said first well regions from each other;
    a second ohmic electrode located over said second well region;
    a third separation region of the first conductivity type that is positioned closer to said first well regions than said second ohmic electrode in said second well region and that is formed to penetrate said second well region from a surface layer of said second well region in the depth direction;
    a second Schottky electrode located on said third separation region;
    a gate electrode located, through a first insulating film, over part of said first and second well regions except for positions in which said first and second Schottky electrodes and said first and second ohmic electrodes are located;
    a second insulating film formed so as to cover said gate electrode; and
    a source electrode located so as to cover said first and second Schottky electrodes, said first and second ohmic electrodes, and said second insulating film.

2. The semiconductor device according to claim 1, wherein a distance between said second Schottky electrode and each of said first well regions is less than or equal to 3 μm.

3. The semiconductor device according to claim 1, wherein said third separation region is continuously formed in a direction that intersects a direction from said second well region toward said first well regions in plan view.

4. The semiconductor device according to claim 1, wherein said third separation region surrounds said second ohmic electrode plan view and at least part of the portion that surrounds said ohmic electrode is missing.

5. The semiconductor device according to claim 1, further comprising:
    a fourth separation region of the first conductivity type formed to penetrate said second well region from a surface layer of said second well region in the depth direction; and a third Schottky electrode located, on said fourth separation region,
wherein said second ohmic electrode is located over said second well region.

6. The semiconductor device according to claim 1, wherein said drift layer comprises silicon carbide.

7. A semiconductor device, comprising:
a drift layer of a first conductivity type formed on a semiconductor substrate of the first conductivity type;
a plurality of first well regions of a second conductivity type located at an interval in a surface layer of said drift layer;
a second well region of the second conductivity type formed on both sides, as seen in plan view, of some of said plurality of first well regions in the surface layer of said drift layer, said second well region having a formation area, larger than that of each of said first well regions;
a sense region that includes at least one first well region of said plurality of first well regions and is separated from another first well region of said first well regions by said second well region formed on both sides, as seen in plan view, of said sense region;
a first separation region of the first conductivity type formed to penetrate each of said first well regions in at least said sense region from a surface layer of each of said first well regions in a depth direction;
a source region of the first conductivity type formed on both sides, as seen in plan view, of said first separation region in the surface layer of each of said first well regions in at least said sense region;
a first Schottky electrode located on said first separation region;
a first ohmic electrode located over each of said first well regions and located on said source region in at least said sense region;
a second separation region of the first conductivity type being a region for separating said first well regions from each other;
a second ohmic electrode located over said second well region;
a third separation region of the first conductivity type that is positioned closer to said sense region than said second ohmic electrode in said second well region and that is formed to penetrate said second well region from a surface, layer of said second well region in the depth direction;
a second Schottky electrode located on said third separation region;
a gate electrode located, through a first insulating film, over part of said first and second well regions except for positions in which said first and second Schottky electrodes and said first and second ohmic electrodes are, located;
a second insulating film formed so as to cover said gate electrode; and
a sense electrode located so as to cover said first Schottky electrode and said first ohmic electrode.

8. The semiconductor device according to claim 7, wherein a distance between said second Schottky electrode and each of said first well regions is less than or equal to 3 µm.

9. The semiconductor device according to claim 7, wherein said third separation region is continuously formed in a direction that intersects a direction from said second well region toward said sense region in plan view.

10. The semiconductor device according to claim 7, wherein
said sense region includes said plurality of first well regions, and
said source region is not formed in at least one first well region of said first well regions in said sense region.

11. The semiconductor device according to claim 7, wherein
said sense region includes said plurality of first well regions, and
said second separation region is not formed between part of said sense region and another first well region of said first well regions.

12. The semiconductor device according to claim 7, wherein said drift layer comprises silicon carbide.

* * * * *